United States Patent
Watanabe et al.

(10) Patent No.: US 9,893,234 B2
(45) Date of Patent: Feb. 13, 2018

(54) COMPOSITE SUBSTRATE FOR LIGHT-EMITTING ELEMENT AND PRODUCTION METHOD THEREFOR

(71) Applicant: NGK INSULATORS, LTD., Nagoya-Shi (JP)

(72) Inventors: Morimichi Watanabe, Nagoya (JP); Jun Yoshikawa, Nagoya (JP); Tsutomu Nanataki, Nagoya (JP); Katsuhiro Imai, Nagoya (JP); Tomohiko Sugiyama, Nagoya (JP); Takashi Yoshino, Nagoya (JP); Yukihisa Takeuchi, Nagoya (JP); Kei Sato, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 15/182,741

(22) Filed: Jun. 15, 2016

(65) Prior Publication Data

US 2016/0293800 A1    Oct. 6, 2016

Related U.S. Application Data

(63) Continuation of application No. PCT/JP2014/082424, filed on Dec. 8, 2014.

(30) Foreign Application Priority Data

Dec. 18, 2013 (JP) ................................ 2013-260856
Mar. 31, 2014 (JP) ................................ 2014-071231
(Continued)

(51) Int. Cl.
*H01L 29/06* (2006.01)
*H01L 33/16* (2010.01)
(Continued)

(52) U.S. Cl.
CPC ............... *H01L 33/16* (2013.01); *C30B 9/10* (2013.01); *C30B 19/02* (2013.01); *C30B 25/18* (2013.01);
(Continued)

(58) Field of Classification Search
CPC ......... H01L 33/16; H01L 33/32; H01L 33/06; H01L 33/0066; H01L 33/0025;
(Continued)

(56) References Cited

U.S. PATENT DOCUMENTS 5,714,274 A * 2/1998 Sugiura ............... C09K 11/7718
                                                              313/504
6,214,427 B1    4/2001 Levinson
(Continued)

FOREIGN PATENT DOCUMENTS

JP    09-027636 A1    1/1997
JP    09-172199 A1    6/1997
(Continued)

OTHER PUBLICATIONS

International Search Report and Written Opinion (Application No. PCT/JP2014/082424) dated Feb. 24, 2015 (with English translation).
(Continued)

*Primary Examiner* — Vu A Vu
(74) *Attorney, Agent, or Firm* — Burr & Brown, PLLC

(57) ABSTRACT

Provided is a light emitting device composite substrate suitable for manufacturing large-area light emitting devices at low cost. The light emitting device composite substrate comprises a substrate composed of an oriented polycrystalline alumina sintered body, and a light emitting functional layer formed on the substrate and having two or more layers composed of semiconductor single crystal grains, wherein
(Continued)

each of the two or more layers has a single crystal structure in a direction approximately normal to the substrate.

39 Claims, 5 Drawing Sheets

(30) Foreign Application Priority Data

May 30, 2014 (JP) ................................. 2014-112014
Sep. 29, 2014 (JP) ................................. 2014-199193

(51) Int. Cl.
| | |
|---|---|
| *C30B 9/10* | (2006.01) |
| *C30B 19/02* | (2006.01) |
| *C30B 25/18* | (2006.01) |
| *C30B 29/40* | (2006.01) |
| *H01L 21/02* | (2006.01) |
| *H01L 33/06* | (2010.01) |
| *H01L 33/32* | (2010.01) |
| *H01L 33/00* | (2010.01) |

(52) U.S. Cl.
CPC .......... *C30B 25/183* (2013.01); *C30B 29/406* (2013.01); *H01L 21/0242* (2013.01); *H01L 21/0254* (2013.01); *H01L 21/0262* (2013.01); *H01L 21/02458* (2013.01); *H01L 21/02554* (2013.01); *H01L 21/02576* (2013.01); *H01L 21/02579* (2013.01); *H01L 21/02628* (2013.01); *H01L 21/02631* (2013.01); *H01L 33/0008* (2013.01); *H01L 33/0025* (2013.01); *H01L 33/0066* (2013.01); *H01L 33/06* (2013.01); *H01L 33/32* (2013.01); *H01L 33/0075* (2013.01)

(58) Field of Classification Search
CPC ............. H01L 33/0008; H01L 21/0262; H01L 21/0242; H01L 21/02631; H01L 21/02458; H01L 21/0254; H01L 21/02554; H01L 21/02576
USPC .......................................................... 257/13
See application file for complete search history.

(56) References Cited

U.S. PATENT DOCUMENTS 8,304,797 B2 * 11/2012 Galvez ................ H01L 25/0753
257/98
2013/0313567 A1    11/2013 Furuya et al.

FOREIGN PATENT DOCUMENTS

| | | |
|---|---|---|
| JP | 2004-359495 A1 | 12/2004 |
| JP | 2009-073710 A1 | 4/2009 |
| JP | 2009-111019 A1 | 5/2009 |
| JP | 2012-184144 A1 | 9/2012 |

OTHER PUBLICATIONS

Extended European Search Report, European Application No. 14872045.1, dated Jul. 13, 2017 (11 pages).
Sasaki, T., et al. "New Developments in Crystal Growth from Solutions: Oxides, Proteins, and Nitrides," *Journal of Crystal Growth*, vol. 310, No. 7-9, dated Apr. 1, 2008 (pp. 1288-1297).
Ehrentraut, D., et al. "A Brief Review on the Na-Flux Method Toward Growth of Large-Size GaN Crystal," *Springer Series in Materials Science*, vol. 133, dated Jan. 1, 2010 (pp. 235-244).

\* cited by examiner

COMPOSITE SUBSTRATE FOR LIGHT-EMITTING ELEMENT AND PRODUCTION METHOD THEREFOR

CROSS-REFERENCE TO RELATED APPLICATIONS

This application is a continuation application of PCT/JP2014/082424 filed Dec. 8, 2014, which claims priority to Japanese Patent Application No. 2013-260856 filed Dec. 18, 2013, Japanese Patent Application No. 2014-071231 filed Mar. 31, 2014, Japanese Patent Application No. 2014-112014 filed May 30, 2014, and Japanese Patent Application No. 2014-199193 filed Sep. 29, 2014, the entire contents all of which are incorporated herein by reference.

BACKGROUND OF THE INVENTION

1. Field of the Invention

The present invention relates to a composite substrate for light emitting devices and a manufacturing method therefor.

2. Description of the Related Art

Light emitting diodes (LEDs) having various gallium nitride (GaN) layers on GaN single crystal and LEDs having various GaN layers on sapphire (α-alumina single crystal) are known as LEDs including single crystal substrates. For example, those LEDs are in mass production that have a structure formed by stacking an n-type GaN layer, a multiple quantum well (MQW) layer in which a quantum well layer composed of an InGaN layer and a barrier layer composed of a GaN layer are alternately stacked, and a p-type GaN layer in this order on a sapphire substrate. Moreover, a multi-layer substrate suitable for such use is also proposed. For example, Patent Document 1 (JP2012-184144A) discloses a gallium nitride crystal multi-layer substrate including a sapphire base substrate and a gallium nitride crystal layer formed by crystal growth on the substrate.

CITATION LIST

Patent Document

Patent Document 1: JP2012-184144A

SUMMARY OF THE INVENTION

However, such single crystal substrates in general have small areas and are expensive. In particular, while there are demands in recent years for reduction of production costs of LEDs having large-area substrates, it is not easy to mass-produce large-area single crystal substrates, and doing so results in even higher production costs. Accordingly, an inexpensive material is desired that can be an alternative material for single crystal substrates of sapphire or the like and that is suitable for large-area substrates.

The inventors have currently found that it is possible to provide a large-area light emitting device composite substrate suitable for manufacturing light emitting devices at low cost by using an oriented polycrystalline alumina sintered body as a substrate and forming thereon two or more layers composed of semiconductor single crystal grains, wherein each of the two or more layers has a single crystal structure in the direction approximately normal to the substrate.

Therefore, an object of the present invention is to provide a composite substrate for light emitting devices, which is suitable for manufacturing large-area light emitting devices at low cost.

According to an aspect of the present invention, there is provided a composite substrate for light emitting devices, comprising:
a substrate composed of an oriented polycrystalline alumina sintered body; and
a light emitting functional layer formed on the substrate and having two or more layers composed of semiconductor single crystal grains, wherein each of the two or more layers has a single crystal structure in a direction approximately normal to the substrate.

According to another aspect of the present invention, there is provided a light emitting device produced with the composite substrate for light emitting devices of the present invention.

According to yet another aspect of the present invention, there is provided a method for manufacturing a composite substrate for light emitting devices, the method comprising the steps of:
providing an oriented polycrystalline alumina sintered body as a substrate;
forming a seed crystal layer comprising gallium nitride on the substrate by MOCVD;
forming a layer comprising gallium nitride as a buffer layer on the seed crystal layer by Na flux; and
optionally, forming a light emitting functional layer composed of a gallium-nitride-based material on the buffer layer.

DETAILED DESCRIPTION OF THE INVENTION

Composite Substrate for Light Emitting Devices

Figure 1:
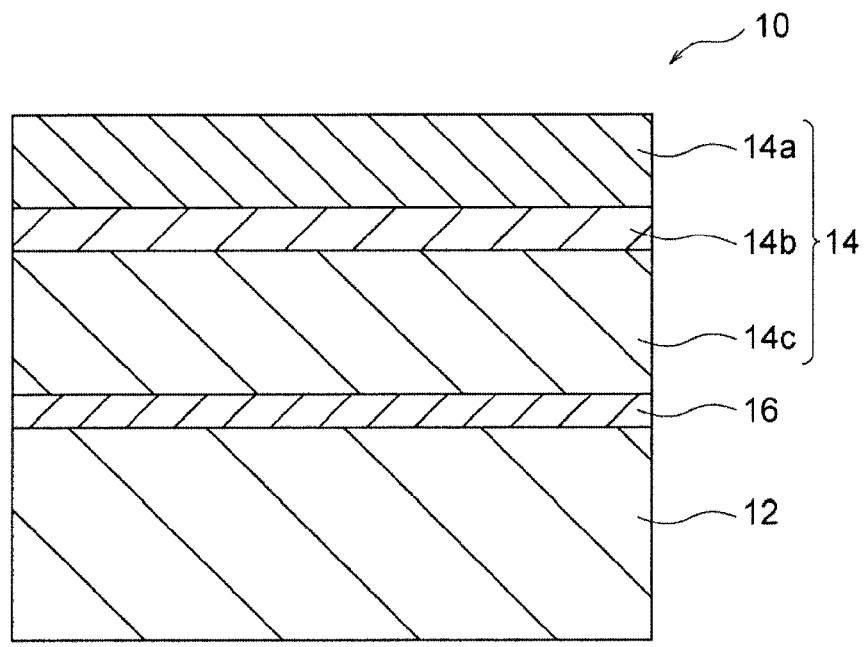
FIG. 1 is a schematic cross-sectional diagram showing one example of the composite substrate for light emitting devices of the present invention.

FIG. 1 schematically shows the layer configuration of a composite substrate for light emitting devices according to one aspect of the present invention. A light emitting device composite substrate 10 shown in FIG. 1 (hereinafter referred to as a composite substrate 10) comprises a substrate 12 and a light emitting functional layer 14 formed on the substrate 12. The substrate 12 is composed of an oriented polycrystalline alumina sintered body. The light emitting functional layer 14 has two or more layers composed of semiconductor single crystal grains, each of the two or more layers having a single crystal structure in the direction approximately normal to the substrate. This light emitting functional layer 14 emits light based on the principle of light emitting devices such as LEDs by suitably providing electrodes and the like and applying voltage. Accordingly, the use of the composite substrate 10 having such a configuration makes it possible to produce light emitting devices such as LEDs. In particular, the substrate 12 used in the present invention is an oriented polycrystalline alumina sintered body and is not a sapphire substrate, which is an alumina single crystal widely used to date. The oriented polycrystalline alumina sintered body is different from single crystal substrates made of sapphire or the like that take an extended period of time to grow from seed crystals, and, as will be described below, the oriented polycrystalline alumina sintered body can be efficiently manufactured through shaping and firing by using a commercially available plate-shaped alumina powder and is thus not only able to be manufactured at low cost but also suitable for having a large area due to ease in shaping. That is to say, the oriented polycrystalline alumina sintered body can be produced or obtained significantly at lower cost and with a larger area than single crystal substrates made of sapphire or the like. According to the inventors' findings, a light emitting device composite substrate suitable for manufacturing large-area light emitting devices at low cost can be provided by using the oriented polycrystalline alumina sintered body as a substrate and allowing semiconductor single crystal grains to grow thereon. In this way, the composite substrate 10 of the present invention is extremely suitable for manufacturing large-area light emitting devices at low cost.

The substrate 12 is composed of an oriented polycrystalline alumina sintered body. Alumina is aluminum oxide ($Al_2O_3$) and is typically α-alumina having the same corundum-type structure as single crystal sapphire, and the oriented polycrystalline alumina sintered body is a solid in which a countless number of alumina crystal grains in an oriented state are bonded to each other by sintering. Alumina crystal grains contain alumina and may contain a dopant and inevitable impurities as other elements, or may be composed of alumina and inevitable impurities. The oriented polycrystalline alumina sintered body may contain an additive as a sintering aid in a grain boundary phase. Although the oriented polycrystalline alumina sintered body may also contain another phase or another element as described above in addition to alumina crystal grains, preferably, the oriented polycrystalline alumina sintered body is composed of alumina crystal grains and inevitable impurities. The oriented plane of the oriented polycrystalline alumina sintered body to be provided with a light emitting functional layer is not particularly limited and may be a c-plane, an a-plane, an r-plane, an m-plane, or the like.

In any case, the oriented polycrystalline alumina sintered body is composed of an alumina sintered body containing numerous alumina single crystal grains which are, to some extent or highly, oriented in a certain direction. The polycrystalline alumina sintered body oriented in this way is stronger and less expensive than alumina single crystals and, therefore, enables manufacture of surface light emitting devices that are significantly less expensive and yet have a larger area than those manufactured when a single crystal substrate is used. In addition, the use of the oriented polycrystalline alumina sintered body makes it possible to achieve high luminous efficiency as well. In particular, when the constitutive layers of the light emitting functional layer 14 are formed on the oriented substrate 12 by way of epitaxial growth or crystal growth similar thereto, a state is achieved in which crystal orientation is mostly aligned in the direction approximately normal to the substrate, and therefore high luminous efficiency is obtained which is comparable to that obtained when a single crystal substrate is used. Although it is preferable that the oriented polycrystalline alumina sintered body is translucent, the sintered body is not limited in this respect. In the case where the sintered body is translucent, a technique such as laser lift-off can be used for removing the oriented polycrystalline plate. In addition to commonly used pressureless sintering methods using an air atmosphere furnace, a nitrogen atmosphere furnace, a hydrogen atmosphere furnace, or the like, pressure sintering methods such as hot isostatic pressing (HIP), hot pressing (HP), and spark plasma sintering (SPS), and combination thereof can be used for obtaining such oriented alumina sintered bodies. Due to these various factors, according to the present invention in which a plate-shaped oriented polycrystalline alumina sintered body is used as a substrate, it is possible to inexpensively provide a substrate for light emitting devices having high luminous efficiency and capable of homogenous light emission, thereby enabling a reduction of the manufacturing cost of light emitting devices. Moreover, with the substrate of the present invention, it is possible to achieve surface light emitting devices having an increased light emitting device area, and such devices are applicable to large-area surface light emitting lightings and other uses.

The semiconductor single crystal grains constituting the light emitting functional layer in the light emitting device composite substrate are likely to be highly crystalline, and the density of defects such as dislocation can be kept low. Although the reason why the crystal grains constituting the light emitting functional layer have a low defect density is not clear, it is presumed that among the lattice defects occurring during the initial stage of production of the light emitting functional layer, those that develop with tilt toward the horizontal direction are absorbed by the grain boundary as growth progresses, and thus disappear.

From the viewpoint of lowering the density of defects such as dislocation contained in the light emitting functional layer, it is more preferable that some or all single crystal grains constituting the outermost surface of the oriented polycrystalline alumina sintered body are arranged so as to be slightly tilted randomly from a certain direction (such as a c-plane, an a-plane, or a like reference direction). Approximately all or a certain amount of the tilted grains may be tilted at an approximately constant angle, or may be tilted at various directions and/or in various angles so as to have a distribution within a certain range (preferably 0.5 to 20° C. Moreover, tilted grains and non-tilted grains may be intermixed in a desired proportion. Alternatively, the plate surface of the oriented polycrystalline alumina sintered body may be obliquely polished relative to the reference plane to allow the exposed surface of the grains to be tilted in a certain direction, or a plane slightly tilted from the reference direction of the grains at the outermost surface may be exposed by processing into a wave-like form or the like. In any of the above cases, it is preferable that some or all alumina single crystal grains constituting the outermost surface of the oriented polycrystalline alumina sintered body oriented in a reference direction such as a c-plane or an a-plane are arranged in a tilted manner so that their reference orientation is shifted within a range of 0.5 to 20° C. from the normal direction of the substrate.

On the other hand, in the case where an unoriented polycrystalline alumina sintered body is used for the substrate, grains with various crystal orientations undergo crystal growth in random directions when the constitutive layers of the light emitting functional layer 14 are formed. As a result, crystal phases mutually interfere, and it is thus not possible to create a state in which the crystal orientation is aligned in the direction approximately normal to the substrate. Moreover, since the rate of crystal growth is different depending on the crystal orientation, a homogenous, even light emitting functional layer cannot be formed, and it is thus difficult to form a light emitting functional layer of good quality.

As described above, the use of an oriented polycrystalline alumina substrate makes it possible to manufacture a substrate for surface light emitting devices, which is less expensive and has a larger area than those manufactured when a single crystal substrate is used. Therefore, it is preferable that the substrate 12 has a diameter of 50.8 mm (2 inches) or greater, more preferably 100 mm (4 inches) or greater, and even more preferably 200 mm (8 inches) or greater. A larger substrate 12 is preferable from the viewpoint of production cost because the number of producible light emitting devices is increased, and is also preferable from the viewpoint of use in surface light emitting devices because the usable device area is enlarged so as to expand applications to surface light emitting lightings and the like. Therefore, the upper limits of the area and size thereof should not be specified. It is preferable that the substrate 12 is circular or substantially circular as viewed from above, but the shape is not limited thereto. In the case where the substrate 12 is not circular or substantially circular, the area is preferably 2026 $mm^2$ or greater, more preferably 7850 $mm^2$ or greater, and even more preferably 31400 $mm^2$ or greater. For applications that do not require a large area, the area may be smaller than the above range such as 50.8 mm (2 inches) or less in diameter, or 2026 $mm^2$ or less in terms of area. Although the thickness of the substrate 12 is not limited as long as it is self-supporting, an excessively large thickness is not preferable from the viewpoint of production cost. Therefore, the thickness of the substrate 12 is preferably 20 μm or greater, more preferably 100 μm or greater, and even more preferably 100 to 1000 μm. Meanwhile, in the case of forming gallium nitride into a film, the entire substrate may warp due to stress resulting from the difference between the thermal expansions of alumina and gallium nitride, thus adversely affecting the subsequent process. Although stress varies according to the method for forming a gallium nitride film, film formation conditions, film thickness, substrate diameter, and other factors, a thick oriented polycrystalline alumina substrate may be used as one way of suppressing warpage due to stress. For example, in the case of producing layers including a light emitting functional layer having a thickness of 300 μm on an oriented polycrystalline alumina substrate having a diameter of 50.8 mm (2 inches), the thickness of the oriented polycrystalline alumina sintered body may be 900 μm or greater, 1300 μm or greater, or 2000 μm or greater. In this way, the thickness of the oriented polycrystalline alumina substrate may be suitably selected in consideration of production cost, warpage suppression, or the like.

The average grain diameter at the plate surface of alumina grains constituting the oriented polycrystalline alumina sintered body is preferably 0.3 to 1000 μm, more preferably 3 to 1000 μm, even more preferably 10 μm to 200 μm, and particularly preferably 14 μm to 200 μm. Alternatively, in the case of considering that the cross-sectional average diameter of semiconductor single crystal grains at the top surface (the surface facing a side opposite to the substrate 12) is made larger than the cross-sectional average diameter at the bottom surface (the surface facing toward the substrate 12) by providing a grain diameter increasing layer, which will be described below, the sintered grain diameter at the plate surface of grains constituting the oriented polycrystalline sintered body is preferably 10 μm to 100 μm and more preferably 14 μm to 70 μm. The overall average grain diameter of the oriented polycrystalline alumina sintered body correlates with the average grain diameter at the plate surface, and when the diameter is within these ranges, the sintered body has excellent mechanical strength. Moreover, such a diameter results in an excellent luminous efficiency of the light emitting functional layer formed above the oriented polycrystalline alumina sintered body. The average grain diameter at the plate surface of sintered body grains in the present invention is measured by the following method. That is, the plate surface of a plate-shaped sintered body is polished, and an image is taken with a scanning electron microscope. The visual field range is determined in such a way that each straight line drawn diagonally in the obtained image crosses 10 to 30 grains. The average grain diameter at the plate surface is determined by diagonally drawing two straight lines on the obtained image, taking the average of the line segment lengths inside all grains crossed by the straight lines, and multiplying the average by 1.5. When the boundary of sintered body grains cannot be clearly identified in the scanning microscope image of the plate surface, the above measurement may be carried out after emphasizing the boundary by thermal etching (for example, for 45 minutes at 1550° C.) or chemical etching.

The direction in which crystals are oriented in the oriented polycrystalline alumina sintered body is not particularly limited, and it may be the direction of a c-plane, an a-plane, an r-plane, an m-plane, or the like, and from the viewpoint of lattice constant matching, it is preferable that crystals are c-plane oriented in the case of using a gallium-nitride-based material, a zinc-oxide-based material, or an aluminum-nitride-based material for the light emitting functional layer. As for the degree of orientation, for example, the degree of orientation at the plate surface is preferably 50% or greater, more preferably 65% or greater, even more preferably 75% or greater, particularly preferably 85% or greater, particularly more preferably 90% or greater, and most preferably 95% or greater. The degree of orientation can be determined by obtaining an XRD profile through irradiating the plate surface of plate-shaped alumina with X-rays using an XRD apparatus (such as RINT-TTR III manufactured by Rigaku Corporation) and making a calculation according to the formulae below.

[Mathematical Formula 1]

$$\text{Degree of Orientation } [\%] = \frac{p - p_0}{1 - p_0} \times 100$$

$$p_0 = \frac{I_0(hkl)}{\Sigma I_0(hkl)}$$

$$p = \frac{I_s(hkl)}{\Sigma I_s(hkl)}$$

where $I_0(hkl)$ and $I_s(hkl)$ are the integral values)($2\theta=20-70°$ C. of the diffraction intensities from the (hkl) planes in ICDD No. 461212 and a sample, respectively.

The oriented polycrystalline alumina sintered body can be manufactured by shaping and sintering, using a plate-shaped alumina powder as a raw material. A plate-shaped alumina powder is sold in the market and is commercially available. Although the type and the shape of the plate-shaped alumina powder are not particularly limited as long as a dense oriented polycrystalline alumina sintered body can be obtained, the average grain diameter may be 0.4 to 15 μm and the thickness may be 0.05 to 1 μm, and a mixture of two or more raw materials having different average grain diameters within this range may be used. Preferably, a plate-shaped alumina powder can be formed into an oriented green body by a technique that uses shearing force. Preferable examples of techniques that use shearing force include tape casting, extrusion molding, doctor blade method, and any combination of these. In the orientation technique that uses shearing force, it is preferable, in any technique exemplified above, that additives such as a binder, a plasticizer, a dispersing agent, and a dispersion medium are suitably added to the plate-shaped alumina powder to form a slurry, and the slurry is allowed to pass through a slit-shaped narrow discharge port to discharge the slurry to shape a sheet form on a base. The slit width of the discharge port is preferably 10 to 400 μm. The amount of the dispersion medium is adjusted so that the viscosity of the slurry is preferably 5000 to 100000 cP and more preferably 20000 to 60000 cP. The thickness of the oriented green body shaped into a sheet form is preferably 5 to 500 μm and more preferably 10 to 200 μm. It is preferable that numerous pieces of this oriented green body that has been shaped into a sheet form are stacked on top of the other to form a precursor laminate having a desired thickness, and pressing is performed on this precursor laminate. This pressing can be preferably performed by packing the precursor laminate in a vacuum pack or the like and subjecting it to isostatic pressing in hot water at 50 to 95° C. under a pressure of 10 to 2000 kgf/cm². Moreover, the oriented green body that has been shaped into a sheet form, or the precursor laminate, may be subjected to processing by a roll press method (such as a heating roll press or a calender roll). Moreover, when extrusion molding is used, the flow channel within a metal mold may be designed so that after passing through a narrow discharge port within the metal mold, sheets of the green body are integrated into a single body within the metal mold, and the green body is ejected in a laminated state. It is preferable to degrease the resulting green body in accordance with known conditions. The oriented green body obtained in the above manner is fired by, in addition to ordinary pressureless firing using an air atmosphere furnace, a nitrogen atmosphere furnace, a hydrogen atmosphere furnace, or the like, pressure sintering methods such as hot isostatic pressing (HIP), hot pressing (HP), and spark plasma sintering (SPS), and combination thereof, to form an alumina sintered body containing oriented alumina crystal grains. Although the firing temperature and the firing time in the above firing depend on the firing method, the firing temperature may be 1000 to 1950° C., preferably 1100 to 1900° C., and more preferably 1500 to 1800° C., and the firing time may be 1 minute to 10 and preferably 30 minutes to 5 hours. From the viewpoint of promoting densification, firing is preferably performed through a first firing step of firing the green body in a hot press at 1500 to 1800° C. for 2 to 5 hours under a surface pressure of 100 to 200 kgf/cm², and a second firing step of re-firing the resulting sintered body with a hot isostatic press (HIP) at 1500 to 1800° C. for 30 minutes to 5 hours under a gas pressure of 1000 to 2000 kgf/cm². Although the firing time at the aforementioned firing temperature is not particularly limited, it is preferably 1 to 10 hours and more preferably 2 to 5 hours. In the case of imparting translucency, a preferable example is a method in which a high-purity plate-shaped alumina powder is used as a raw material and fired in an air atmosphere furnace, a hydrogen atmosphere furnace, a nitrogen atmosphere furnace, or the like at 1100 to 1800° C. for 1 minute to 10 hours. A method may be used in which the resulting sintered body is re-fired in a hot isostatic press (HIP) at 1200 to 1400° C. or 1400 to 1950° C. for 30 minutes to 5 hours under a gas pressure of 300 to 2000 kgf/cm². The fewer the grain boundary phases are, the more preferable it is, and therefore it is preferable that the plate-shaped alumina powder has high purity, and more preferably the purity is 98% or higher, even more preferably 99% or higher, particularly preferably 99.9% or higher, and most preferably 99.99% or higher. The firing conditions are not limited to those described above, and the second firing step with, for example, hot isostatic pressing (HIP) may be omitted as long as densification and high orientation can be simultaneously achieved. Moreover, an extremely small amount of additive may be added to the raw material as a sintering aid. Addition of a sintering aid, although it is contradictory to reducing the amount of grain boundary phase, is for reducing pores that are one of the factors causing scattering of light and, as a result, increasing translucency. Examples of such sintering aids include at least one selected from oxides such as $MgO$, $ZrO_2$, $Y_2O_3$, $CaO$, $SiO_2$, $TiO_2$, $Fe_2O_3$, $Mn_2O_3$, and $La_2O_3$, fluorides such as $AlF_3$, $MgF_2$, and $YbF_3$, and the like. Among these, MgO, CaO, $SiO_2$, and $La_2O_3$ are preferable, and MgO is particularly preferable. From the viewpoint of translucency, however, the amount of additive should be minimized, and is preferably 3000 ppm or less, more preferably 1000 ppm or less, and even more preferably 700 ppm or less.

Moreover, the oriented polycrystalline alumina sintered body can be produced also by shaping and sintering, using a mixed powder in which a plate-shaped alumina powder is suitably added to a fine alumina powder and/or transition alumina powder as a raw material. In this production method, crystal growth and densification occur through a so-called TGG (Templated Grain Growth) process in which the plate-shaped alumina powder serves as a seed crystal (template), the fine alumina powder and/or transition alumina powder serves as a matrix, and the template grows homoepitaxially while incorporating the matrix. As for the grain diameters of the plate-shaped alumina grains serving as a template and of the matrix, the larger the grain diameter ratio thereof is, the more easily the grains grow. For example, when the average grain diameter of the template is 0.5 to 15 μm, the average grain diameter of the matrix is preferably 0.4 μm or less, more preferably 0.2 μm or less, and even more preferably 0.1 μm or less. The mixing ratio of the template and the matrix varies according to the grain diameter ratio, firing conditions, and presence or absence of an additive. For example, the template/matrix ratio may be 50/50 to 1/99 wt % when a plate-shaped alumina powder having an average grain diameter of 2 μm is used for the template and a fine alumina powder having an average grain diameter of 0.1 μm is used for the matrix. From the viewpoint of promoting densification, at least one selected from oxides such as $MgO$, $ZrO_2$, $Y_2O_3$, $CaO$, $SiO_2$, $TiO_2$, $Fe_2O_3$, $Mn_2O_3$, and $La_2O_3$, fluorides such as $AlF_3$, $MgF_2$, and $YbF_3$, and the like may be added as a sintering aid, and MgO, CaO, $SiO_2$, and $La_2O_3$ are preferable, and MgO is particularly preferable. In such a technique as well, a high-quality oriented polycrystalline alumina sintered body can be obtained by the aforementioned pressure sintering methods such as hot isostatic pressing (HIP), hot pressing (HP), and spark plasma sintering (SPS), and combination thereof, in addition to ordinary pressureless firing using an air atmosphere furnace, a nitrogen atmosphere furnace, a hydrogen atmosphere furnace, or the like.

The alumina sintered body obtained in this way is a polycrystalline alumina sintered body oriented in the direction of a desired plane such as a c-plane in accordance with the type of the aforementioned raw-material plate-shaped alumina powder. It is preferable that the oriented polycrystalline alumina sintered body obtained in this way is ground with a grinding wheel to flatten the plate surface, and then the plate surface is smoothed by lapping using diamond abrasive grains to obtain an oriented alumina substrate.

The light emitting functional layer 14 is formed on the substrate 12. The light emitting functional layer 14 may be formed on the entire surface or a part of the substrate 12, or when a buffer layer as described later is formed on the substrate 12, the light emitting functional layer 14 may be formed on the entire surface or a part of the buffer layer 16. The light emitting functional layer 14 has two or more layers composed of semiconductor single crystal grains, each of the two or more the layers having a single crystal structure in the direction approximately normal to the substrate, and can take a variety of known layer configurations that bring about light emission based on the principle of light emitting devices represented by LEDs by suitably providing an electrode and/or a phosphor and applying voltage. Therefore, the light emitting functional layer 14 may emit visible light such as blue or red, or may emit ultraviolet light with or without visible light. It is preferable that the light emitting functional layer 14 constitutes at least a part of a light emitting device that utilizes a p-n junction, and this p-n junction may include an active layer 14b between a p-type layer 14a and an n-type layer 14c as shown in FIG. 1. At this time, a double heterojunction or a single heterojunction (hereinafter collectively referred to as a heterojunction) may be used in which a layer having a smaller band gap than the p-type layer and/or the n-type layer is used as the active layer. Moreover, as one form of p-type layer/active layer/n-type layer, a quantum well structure can be adopted in which the thickness of the active layer is made small. Needless to say, in order to obtain a quantum well, a double heterojunction should be employed in which the band gap of the active layer is made smaller than those of the p-type layer and the n-type layer. Moreover, a multiple quantum well structure (MQW) may be used in which a large number of such quantum well structures are stacked. Adopting these structures makes it possible to increase luminous efficiency in comparison to a p-n junction. In this way, it is preferable that the light emitting functional layer 14 includes a p-n junction and/or a heterojunction and/or a quantum well junction, each of which has a light emitting function.

Therefore, the two or more layers constituting the light emitting functional layer 14 can include two or more selected from the group consisting of an n-type layer doped with an n-type dopant, a p-type layer doped with a p-type dopant, and an active layer. The n-type layer, the p-type layer, and the active layer (if present) may be composed of materials whose main components are the same or mutually different.

It is preferable that the layers constituting the light emitting functional layer 14 are each composed of a material, the main component of which is at least one selected from gallium nitride (GaN)-based materials, zinc oxide (ZnO)-based materials, and aluminum nitride (AlN)-based materials, and may suitably contain a dopant for controlling it to be a p-type or an n-type. A particularly preferable material is a gallium nitride (GaN)-based material. Moreover, the material constituting the light emitting functional layer 14 may be a mixed crystal in which AlN, InN, or the like forms a solid solution with GaN, for controlling the band gap thereof. As described in the last paragraph, the light emitting functional layer 14 may be a heterojunction composed of multiple types of material systems. For example, a gallium nitride (GaN)-based material may be used for the p-type layer, and a zinc oxide (ZnO)-based material may be used for the n-type layer. Moreover, a zinc oxide (ZnO)-based material may be used for the p-type layer, a gallium nitride (GaN)-based material may be used for the active layer as well as the n-type layer, and there is not a particular limitation to material combinations.

A buffer layer 16 may be further provided between the light emitting functional layer 14 and the oriented polycrystalline alumina sintered body substrate 12. The buffer layer 16 is for reducing lattice defects resulting from a lattice mismatch between the substrate 12 and the light emitting functional layer 14 to improve crystallinity. When the degree of orientation of the polycrystalline alumina sintered body substrate 12 is low, the formation of the light emitting functional layer 14 directly on the substrate 12 cannot yield a homogenous, even light emitting functional layer, and pores may be formed in the light emitting functional layer. In this regard, the buffer layer 16 can improve their homogeneity and evenness and eliminate the possibility of pores or the like, thereby enabling the formation of the light emitting functional layer 14 of good quality. The buffer layer 16 is preferably made of a highly crystalline material having a crystal structure equivalent or similar to that of the light emitting functional layer 14, and a material having an equivalent or close lattice constant may be used as well. Preferably, the buffer layer 16 has a structure in which grains are grown mostly in conformity with the crystal orientation of the oriented polycrystalline alumina sintered body. In this way, each layer of the light emitting functional layer 14 can be formed while promoting the growth of crystals mostly in conformity with the crystal orientation of the oriented polycrystalline alumina sintered body, which is the substrate 12. It is preferable that the buffer layer 16 is composed of a material, the main component of which is at least one selected from gallium nitride (GaN)-based materials, zinc oxide (ZnO)-based materials, and aluminum nitride (AlN)-based materials, and may suitably contain a dopant for controlling it to be a p-type or an n-type. A particularly preferable material is a gallium nitride (GaN)-based material. Moreover, the material constituting the buffer layer 16 may be a mixed crystal in which AlN, InN, or the like forms a solid solution with GaN or may be a mixed crystal in which MgO, CdO, or the like forms a solid solution with ZnO, for controlling the band gap thereof.

The each layer constituting the light emitting functional layer 14 has a single crystal structure in the direction approximately normal to the substrate and is composed of semiconductor single crystal grains. That is, each layer is composed of semiconductor single crystal grains connected two-dimensionally in the direction of a horizontal plane, and, therefore, has a single crystal structure in the direction approximately normal to the substrate. Therefore, although each layer of the light emitting functional layer 14 is not a single crystal as a whole, it has a single crystal structure in terms of local domains, and can therefore have sufficiently high crystallinity for ensuring a light emitting function. Preferably, each layer of the light emitting functional layer 14 has a structure in which grains are grown mostly in conformity with the crystal orientation of the oriented polycrystalline alumina sintered body, which is the substrate 12. The "structure in which grains are grown mostly in conformity with the crystal orientation of an oriented polycrystalline alumina sintered body" means a structure resulting from crystal growth influenced by the crystal orientation of the oriented polycrystalline alumina sintered body, is not necessarily limited to a structure in which grains are grown completely in conformity with the crystal orientation of the oriented polycrystalline alumina sintered body, and may be a structure in which grains are grown, to some extent, in conformity with the crystal orientation of the oriented polycrystalline alumina sintered body as long as desired light emitting functions can be ensured. That is, this structure also includes a structure in which grains are grown in crystal orientation different from that of the oriented alumina sintered body. In this sense, the expression "structure in which grains are grown mostly in conformity with crystal orientation" can be paraphrased as "structure in which grains are grown in a manner mostly derived from crystal orientation", and this paraphrasing and the above meaning similarly apply to similar expressions in this specification. Therefore, such crystal growth is preferably epitaxial growth, but it is not limited thereto, and may take a variety of similar crystal growth forms. In particular, when the layers respectively constituting the n-type layer, the active layer, the p-type layer, and the like grow in the same crystal orientation, the structure is such that the crystal orientation is mostly aligned with respect to the direction approximately normal to the substrate, and favorable light emitting properties can be obtained. Moreover, it is also preferable that the buffer layer 16 is composed of semiconductor single crystal grains, wherein the layer has a single crystal structure in the direction approximately normal to the substrate, as with the layers of the light emitting functional layer 14. In particular, when a vertically-structured LED is produced with the composite substrate of the present invention, because the semiconductor single crystal grains constituting the light emitting functional layer 14 and the optional buffer layer 16 have a single crystal structure in the direction approximately normal to the substrate, highly resistive grain boundaries do not exist in electrical current paths, and as a result, preferable luminous efficiency is expected. In this regard, in the case of a layer in which grain boundaries exist also in the direction normal to the substrate, highly resistive grain boundaries exist in electrical current paths even when a vertical structure is formed, and thus there is a possibility of impaired luminous efficiency. From these viewpoints, the light emitting device composite substrate of the present invention can be preferably used for a vertically-structured LED.

Therefore, each layer of the light emitting functional layer 14 and the optional buffer layer 16 are observed as a single crystal when viewed in the direction normal to the substrate, and it is also possible to recognize the layers as aggregates of semiconductor single crystal grains having a columnar structure in which grain boundary is observed in a view of the cross section in the horizontal plane direction of the substrate. Here, the "columnar structure" does not mean only a typical vertically long columnar shape, and is defined as having a meaning encompassing various shapes such as a horizontally long shape, a trapezoidal shape, and an inverted trapezoidal shape. As described above, each layer may have a structure in which grains are grown, to some extent, in conformity with the crystal orientation of the oriented polycrystalline alumina sintered body, and does not necessarily need to have a columnar structure in a strict sense. As described above, the growth of single crystal grains due to the influence of the crystal orientation of the oriented polycrystalline alumina sintered body, which is the substrate 12, is considered to be the cause of the columnar structure. Therefore, the average grain diameter at the cross section (hereinafter referred to as a cross-sectional average diameter) of semiconductor single crystal grains that can also be called columnar structures is considered to depend on not only the conditions of film formation but also the average grain diameter at the plate surface of the oriented polycrystalline alumina sintered body. The interface of columnar structures constituting the light emitting functional layer influences luminous efficiency and emission wavelength, and the presence of grain boundaries impairs light transmittance in the cross-sectional direction and causes light to be scattered or reflected. Therefore, in the case of a structure from which light is extracted in the direction normal to the substrate, a luminance increasing effect due to scattered light from grain boundaries is also expected.

As described above, in the case where a vertically-structured LED is produced with the composite substrate of the present invention, it is preferable from the viewpoint of luminous efficiency that the top surface of the light emitting functional layer 14 connect without intervention of a grain boundary to the bottom surface of the light emitting functional layer 14 or the buffer layer 16 facing toward the substrate 12, on which an electrode will be formed after removing the substrate 12. That is, it is preferable that the semiconductor single crystal grains constituting the top surface of the light emitting functional layer 14 (the surface facing the side opposite to the substrate 12) connect to the bottom surface of the light emitting functional layer 14 facing toward the substrate 12 and/or to the bottom surface of the buffer layer 16 facing toward the substrate 12, without intervention of a grain boundary. The presence of a grain boundary causes resistance when electricity is applied, and therefore becomes a factor that deteriorates luminous efficiency. Here, the grain boundary does not refer to the interface between layers. In fact, no grain boundaries exist between layers formed by epitaxial growth.

When gallium nitride crystals are grown by way of epitaxial growth via a vapor phase or a liquid phase, growth occurs not only in the direction normal to the substrate but also in the horizontal direction, depending on the conditions of film formation. At this time, if the quality of grains that serve as a starting point of growth or of seed crystals produced thereon varies, the growth rates of respective GaN crystals differ when producing a sufficiently thick film, and fast-growing grains may grow to cover slow-growing grains, as conceptually depicted in FIG. 8. In the case of such a growth behavior, grains on the top surface side (the side opposite to the substrate 12) are more likely to have a larger diameter than those on the bottom surface side (the side closer to the substrate 12) in the resulting layer. In this case, growth of slow-growing crystals terminates halfway, and a grain boundary may be observed also in the direction normal to the substrate when a certain cross section is observed. However, the grains exposed at the top surface of the layer connect to the bottom surface of the layer without intervention of a grain boundary, and there is not a resistive phase against an electric current. Examples of such an instance include when a thick film is used partially or entirely for the light emitting functional layer 14, and when the buffer layer 16 is provided by Na flux between the light emitting functional layer 14 and the oriented polycrystalline alumina sintered body substrate 12. However, when a part or all of the layers of the light emitting functional layer 14 have such a growth behavior, light emitting properties may be impaired. That is, in a layer (the p-type layer 14a in FIG. 4B) located more toward the top surface (the side opposite to the substrate 12) than a layer or an interface that actually emits light such as the active layer 14b or a p-n junction interface is located, luminous efficiency is impaired when the cross-sectional average diameter on the top surface side (the side opposite to the substrate 12) of such a layer, rather than on the bottom surface side (the side closer to the substrate 12) of such a layer, is greater than the cross-sectional average diameter of the layer or the interface that actually emits light such as the active layer 14b or a p-n junction interface as shown in FIG. 4B. For example, in the regions surrounded by the dashed line in FIG. 4B, grain boundaries exist in the p-type layer 14a, and it is thus considered that an electric current is less likely to flow than in other regions. That is, in the case of such a growth behavior that grains develop to have a large diameter as they grow in a region located more toward the top surface (the side opposite to the substrate 12) than a layer or an interface that actually emits light such as the active layer 14b or a p-n junction interface is located, luminous efficiency is impaired, and therefore such a growth behavior is not preferable.

Figure 4A:
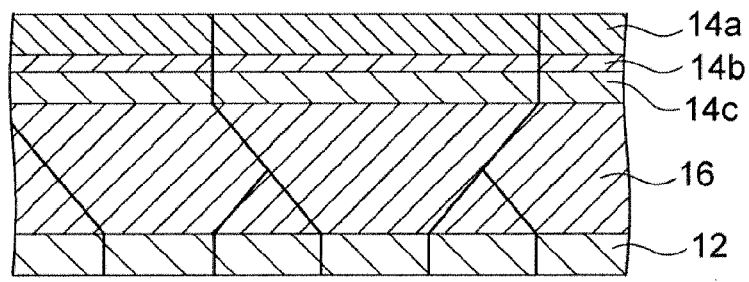
FIG. 4A is a conceptual diagram of the cross-section of a composite substrate for explaining grain boundaries that result in an increased luminous efficiency.
Figure 4B:
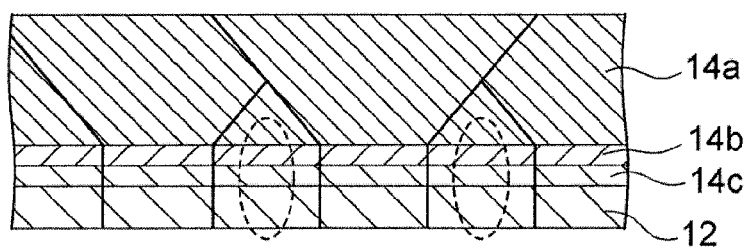
FIG. 4B is a conceptual diagram of the cross-section of a composite substrate for explaining grain boundaries that result in a decreased luminous efficiency.

On the other hand, as shown in FIG. 4A, in the case where grains develop to have a large diameter as they grow in a region located more toward the substrate 12 than the active layer 14b or a p-n junction interface is located, luminous efficiency is enhanced when the cross-sectional average diameter of grains on the top surface side (the side opposite to the substrate 12) is larger than the cross-sectional average diameter of grains on the bottom surface side (the side closer to the substrate 12) in a layer where grains have developed to have such an increased grain diameter (hereinafter referred to as a grain diameter increasing layer), and therefore such a growth behavior is preferable (this can be paraphrased that it is preferable that the number of semiconductor single crystal grains constituting the top surface of the grain diameter increasing layer is smaller than the number of gallium-nitride-based single crystal grains constituting the bottom surface of the grain diameter increasing layer). That is, it is preferable that at least one layer selected from (i) a lower layer among the layers constituting the light emitting functional layer 14, wherein the lower layer is located in a position that is closer to the substrate 12 than the interface or the layer that actually emits light, and (ii) the buffer layer, is the grain diameter increasing layer, wherein the semiconductor crystal grains constituting the at least one layer increase in cross-sectional average diameter from the bottom surface side (the side closer to the substrate 12) toward the top surface side (the side opposite to the substrate 12). Specifically, it is preferable that the grain diameter increasing layer has a $D_T/D_B$ of greater than 1.0. The $D_T/D_B$ is a ratio of a cross-sectional average diameter $D_T$ to a cross-sectional average diameter $D_B$, provided that the cross-sectional average diameter $D_T$ is a cross-sectional average diameter of semiconductor single crystal grains constituting the top surface of the grain diameter increasing layer as determined at the top surface, which faces a side opposite to the substrate 12 (hereinafter referred to as the cross-sectional average diameter $D_T$ of the top surface), and that the cross-sectional average diameter $D_B$ is a cross-sectional average diameter of semiconductor single crystal grains constituting the bottom surface of the grain diameter increasing layer as determined at the bottom surface, which faces toward the substrate 12 (hereinafter referred to as the cross-sectional average diameter $D_B$ of the bottom surface), and the $D_T/D_B$ is more preferably 1.5 or greater, even more preferably 2.0 or greater, particularly preferably 3.0 or greater, and most preferably 5.0 or greater. However, an excessively high $D_T/D_B$ ratio may in turn result in an impaired luminous efficiency, and therefore a ratio of 20 or less is preferable, and a ratio of 10 or less is more preferable. Although the reason of improvement in luminous efficiency is not clear, it is considered that when the ratio $D_T/D_B$ is high, the area of grain boundaries that do not contribute to light emission is reduced due to the increased grain diameter, or crystal defects are reduced due to the increased grain diameter resulting from grain growth. Although the reason of reduction in crystal defect is not clear either, it is also considered that defective grains grow slowly, and grains with less defects grow promptly. On the other hand, when the ratio $D_T/D_B$ is excessively high, paths through which an electric current flows without intervention of grain boundaries are excessively reduced in size on the oriented polycrystalline alumina substrate 12 side. As a result, sufficient electric current paths are not provided, which can be considered as a cause of reduction in luminous efficiency, but the details thereof are not clear.

Crystallinity at the interface between columnar structures constituting the light emitting functional layer 14 is low, and therefore there is a possibility that the luminous efficiency deteriorates, the emission wavelength changes, and the emission wavelength broadens. Therefore, a larger cross-sectional average diameter of the columnar structures is preferable. Preferably, the cross-sectional average diameter of the semiconductor single crystal grains at the outermost surface of the light emitting functional layer 14 is 0.3 µm or greater, more preferably 3 µm or greater, even more preferably 20 µm or greater, particularly preferably 50 µm or greater, and most preferably 70 µm or greater. A larger cross-sectional average diameter results in a higher luminous efficiency and is thus preferable. Therefore, although the upper limit of this cross-sectional average diameter is Not particularly defined, it is realistically 1000 µm or less, more realistically 500 µm or less, and even more realistically 200 µm or less. In order to produce semiconductor single crystal grains having such a cross-sectional average diameter, it is desirable that the sintered grain diameter at the plate surface of alumina grains constituting the oriented polycrystalline alumina sintered body, which is the substrate 12, is 0.3 µm to 1000 µm, more desirably 3 µm to 1000 µm, even more desirably 10 µm to 200 µm, and particularly desirably 14 µm to 200 µm. Alternatively, with a view to providing a grain diameter increasing layer for making the cross-sectional average diameter of semiconductor single crystal grains at the top surface (the surface facing the side opposite to the substrate 12) larger than the cross-sectional average diameter at the bottom surface (the surface facing toward the substrate 12), it is desirable that the diameter at the plate surface of sintered grains constituting the oriented polycrystalline sintered body is 10 µm to 100 µm and more desirably 14 µm to 70 µm.

The cross-sectional average diameter of the light emitting functional layer 14 can be determined as follows. An image of the cross section of the light emitting functional layer 14 is taken with a scanning electron microscope in order to measure the cross-sectional average diameters on the top surface side and the bottom surface side of semiconductor single crystal grains in each layer of the light emitting functional layer 14 formed. Specifically, a sample provided with a film of the light emitting functional layer 14 is cut, a surface (a cross-section) perpendicular to the plate surface is polished with a CP polisher, and then the vicinities of the desired interfaces on the top surface side and the bottom surface side of the light emitting functional layer 14 are observed with a scanning electron microscope. The measurement visual field is configured so as to include 10 to 30 semiconductor single crystal grains of the light emitting functional layer 14 constituting such interfaces. The cross-sectional average grain diameter of semiconductor single crystal grains on the top surface side or the bottom surface side is determined by taking the average of the line segment lengths inside individual grains in the interface portion in the obtained image and multiplying the average by 1.5. The above measurement may be carried out after emphasizing the interface by thermal etching or chemical etching. Also, the cross-sectional average diameter of the buffer layer 16 may be performed as above.

As described above, it is preferable that at least one layer selected from (i) a lower layer among the layers constituting the light emitting functional layer 14, wherein the lower layer is located in a position that is closer to the substrate 12 than the interface or the layer that actually emits light, and (ii) the buffer layer, is the grain diameter increasing layer. From the viewpoint of enhancing luminous efficiency, the grain diameter increasing layer preferably has a large aspect ratio $T/D_T$, wherein the aspect ratio $T/D_T$ is defined as the ratio of a thickness T of the grain diameter increasing layer to the cross-sectional average diameter $D_T$ of semiconductor single crystal grains constituting the top surface of the grain diameter increasing layer as determined at the top surface, the top surface facing the side opposite to the substrate 12. The aspect ratio $T/D_T$ is more preferably 0.7 or greater, even more preferably 1.0 or greater, and particularly preferably 3 or greater. Such an aspect ratio is preferable from the viewpoint of increasing luminous efficiency in the case of LEDs. As for the cause of increased luminous efficiency, it is considered that high-aspect-ratio grains used for the grain diameter increasing layer (e.g., the buffer layer 16) result in a low defect density of a layer provided thereon (e.g., the light emitting functional layer 14), an increased light extraction efficiency, and so on, but details thereof are not clear.

It is preferable that the layers constituting the light emitting functional layer 14 and/or the buffer layer 16 are each composed of a gallium-nitride-based material. For example, the buffer layer 16 composed of a non-doped gallium nitride layer may be provided on the oriented polycrystalline alumina sintered body substrate 12, and, further, an n-type gallium nitride layer and a p-type gallium nitride layer may be grown. The order of stacking the p-type gallium nitride layer and the n-type gallium nitride layer may be inverse. Preferable examples of p-type dopants used for the p-type gallium nitride layer include one or more selected from the group consisting of beryllium (Be), magnesium (Mg), calcium (Ca), strontium (Sr), zinc (Zn), and cadmium (Cd). Preferable examples of n-type dopants used for the n-type gallium nitride layer include one or more selected from the group consisting of silicon (Si), germanium (Ge), tin (Sn), and oxygen (O). Moreover, the p-type gallium nitride layer and/or the n-type gallium nitride layer may be composed of gallium nitride formed into a mixed crystal with a crystal of one or more selected from the group consisting of AlN and InN, and the p-type layer and/or the n-type layer may be this mixed-crystal gallium nitride doped with a p-type dopant or an n-type dopant. For example, doping $Al_xGa_{1-x}N$, which is a mixed crystal of gallium nitride and AlN, with Mg makes it possible to provide a p-type layer, and doping $Al_xGa_{1-x}N$ with Si makes it possible to provide an n-type layer. Forming gallium nitride into a mixed crystal with AlN widens the band gap and makes it possible to shift the emission wavelength toward the high energy side. Moreover, gallium nitride may be formed into a mixed crystal with InN, and this narrows the band gap and makes it possible to shift the emission wavelength toward the low energy side. Between the p-type gallium nitride layer and the n-type gallium nitride layer, there may be an active layer composed of GaN or a mixed crystal of GaN and one or more selected from the group consisting of AlN and InN, that has a smaller band gap than both layers. The active layer has a structure that forms a double heterojunction with a p-type layer and an n-type layer, and a configuration in which this active layer is made thin corresponds to the light emitting device having a quantum well structure, which is one form of a p-n junction, and luminous efficiency can be further increased. Moreover, the active layer may be configured to have a smaller band gap than either layer and be composed of GaN or a mixed crystal of GaN and one or more selected from the group consisting of AlN and InN. Luminous efficiency can be further increased also by such a single heterojunction. The gallium nitride-based buffer layer may be composed of non-doped GaN or n-type or p-type-doped GaN, may contain AlN or InN having a close lattice constant, or may be a mixed crystal formed with GaN and one or more crystals selected from the group consisting of AlN and InN.

The light emitting functional layer 14 and/or the buffer layer 16 may be composed of a plurality of material systems selected from gallium nitride (GaN)-based materials, zinc oxide (ZnO)-based materials, and aluminum nitride (AlN)-based materials. For example, the buffer layer 16 composed of a non-doped gallium nitride layer may be provided on the oriented polycrystalline alumina sintered body substrate 12, and further, a p-type gallium nitride layer and an n-type oxide layer may be grown thereon. The order of stacking the p-type gallium nitride layer and the n-type zinc oxide layer may be inverse. In the case of forming an n-type zinc oxide layer on the buffer layer, the buffer layer 16 may be non-doped or may be composed of an n-type zinc oxide layer. Moreover, the buffer layer 16 composed of a non-doped gallium nitride layer may be provided on the oriented polycrystalline alumina sintered body substrate 12, and further, an n-type gallium nitride layer and a p-type zinc oxide layer may be grown thereon. The order of stacking the n-type gallium nitride layer and the p-type zinc oxide layer may be inverse. In the case of forming a p-type zinc oxide layer on the buffer layer, the buffer layer 16 may be non-doped or may be composed of a p-type zinc oxide layer. Preferable examples of p-type dopants used for the p-type zinc oxide layer include one or more selected from the group consisting of nitrogen (N), phosphorus (P), arsenic (As), carbon (C), lithium (Li), sodium (Na), potassium (K), silver (Ag), and copper (Cu). Moreover, preferable examples of n-type dopants used for the n-type zinc oxide layer include one or more selected from the group consisting of aluminum (Al), gallium (Ga), indium (In), boron (B), fluorine (F), chlorine (Cl), bromine (Br), iodine (I), and silicon (Si).

Methods for producing the light emitting functional layer 14 and the buffer layer 16 are not particularly limited, and preferable examples include vapor phase methods such as MOCVD (metal organic chemical vapor deposition), MBE (molecular beam epitaxy), HVPE (halide vapor phase epitaxy), and sputtering, liquid phase methods such as Na flux, ammonothermal method, hydrothermal method, and sol-gel method, powder methods that utilize solid phase growth of powder, and combinations of these. For example, in the case where the light emitting functional layer 14 and the buffer layer 16 composed of a gallium nitride-based material are produced with MOCVD, at least an organic metal gas containing gallium (Ga) (such as trimethylgallium) and a gas containing at least nitrogen (N) (such as ammonia) as raw materials may be flown over a substrate to allow growth in, for example, an atmosphere containing hydrogen, nitrogen, or both within a temperature range of about 300 to about 1200° C. In this case, film formation may be performed by suitably introducing an organic metal gas containing indium (In) or aluminum (Al) for band gap control as well as silicon (Si) or magnesium (Mg) as an n-type and p-type dopant (such as trimethylindium, trimethylaluminum, monosilane, disilane, and bis-cyclopentadienylmagnesium).

In the case of partially and/or entirely forming the films of the buffer layer 16 and the light emitting functional layer 14, the films of the buffer layer 16 and the light emitting functional layer 14 may be formed after a seed crystal layer is formed on the oriented alumina sintered body substrate. The respective film forming methods for the seed crystal layer, the buffer layer, and the light emitting functional layer are not particularly limited as long as crystal growth is promoted that is mostly in conformity with the crystal orientation of the oriented polycrystalline alumina sintered body substrate 12. For example, in the case of producing a buffer layer and a light emitting functional layer composed of a gallium-nitride-based material by a liquid-phase method such as Na flux or ammonothermal method, film formation by such a liquid-phase method may be performed after an extremely thin gallium nitride seed crystal is formed on the oriented polycrystalline alumina sintered body substrate 12 by vapor-phase epitaxy such as MOCVD, MBE, HVPE, or sputtering. The same film forming method may be used for the entire process. For example, films of the seed crystal layer, the buffer layer 16, and the light emitting functional layer 14 may be each formed by MOCVD. The material of the seed crystal layer is not limited to a gallium-nitride-based material, and any material may be used as long as crystal growth that is mostly in conformity with the crystal orientation of the oriented polycrystalline alumina sintered body substrate 12 is promoted for a layer that will be formed thereon. For example, after an extremely thin zinc oxide seed crystal is produced by vapor-phase epitaxy such as MOCVD, MBE, HVPE, or sputtering, a film of a zinc-oxide-based material may be formed, or a film of a gallium-nitride-based material may be formed on the zinc oxide seed crystal, by liquid-phase epitaxy, vapor-phase epitaxy, solid-phase epitaxy, or the like.

According to a particularly preferable aspect of the present invention, a buffer-layer-equipped composite substrate for light emitting devices can be manufactured as follows. That is, (1) provide an oriented polycrystalline alumina sintered body as the substrate 12, (2) form a seed crystal layer comprising gallium nitride on the substrate 12 by MOCVD, (3) form a layer comprising gallium nitride as the buffer layer 16 on the seed crystal layer by Na flux, and (4), optionally, form the light emitting functional layer 14 composed of a gallium-nitride-based material on the buffer layer 16. According to this procedure, a high-quality, gallium-nitride-based composite substrate 10 for light emitting devices can be produced. A feature of this method is the formation of the buffer layer by Na flux. It is preferable that the formation of the buffer layer 16 by Na flux is performed by filling a crucible containing a seed crystal substrate with a melt composition containing metal Ga and metal Na and optionally a dopant, increasing the temperature and the pressure to 830 to 910° C. and 3.5 to 4.5 MPa, respectively, in a nitrogen atmosphere, and then rotating the crucible while retaining the temperature and the pressure. Although the retention time depends on the intended film thickness, it may be about 10 to about 20 hours or about 20 to about 100 hours. Moreover, it is preferable that the gallium nitride crystals obtained by Na flux in this way are ground with a grinding wheel to flatten the plate surface, and then the plate surface is smoothed by lapping using diamond abrasive grains to provide the buffer layer 16.

Moreover, according to another preferable aspect of the present invention, a buffer-layer-equipped composite substrate for light emitting devices can be manufactured as follows. That is, (1) provide an oriented polycrystalline alumina sintered body as the substrate 12, (2) form a seed crystal layer comprising gallium nitride on the substrate 12 by MOCVD, (3) form a layer composed of a gallium-nitride-based material as the buffer layer 16 on the seed crystal layer by Na flux, (4) form a p-type layer (n-type layer) composed of a gallium-nitride-based material on the buffer layer 16 by MOCVD, (5) form an active layer composed of zinc-oxide-based material on the p-type layer (n-type layer) by MBE, and (6) form an n-type layer (p-type layer) composed of a zinc-oxide-based material on the active layer by a hydrothermal method. Optionally, some of these steps (for example, steps (2), (3), (4), and/or (5)) may be omitted. This procedure makes it possible to produce a high-quality light emitting device composite substrate 10 having a heterojunction involving gallium-nitride-based and zinc-oxide-based materials. The film formation of the gallium-nitride-based material may be entirely performed by MOCVD or Na flux, and the film formation of the zinc-oxide-based material may be performed entirely by a hydrothermal method or MBE or by vapor-phase epitaxy such as MOCVD or sputtering.

Furthermore, an electrode layer and/or a phosphor layer may be provided on the light emitting functional layer 14. This makes it possible to provide the light emitting device composite material in a form that is closer to a light emitting device, enhancing the utility of the light emitting device composite material. The electrode layer, if provided, is preferably provided on the light emitting functional layer 14. The electrode layer may be composed of a known electrode material, and configuring the electrode layer to be a transparent electroconductive film of ITO or the like or a metal electrode with a lattice structure or the like having a high aperture ratio is preferable for being able to increase the efficiency of extracting light produced in the light emitting functional layer.

When the light emitting functional layer 14 can emit ultraviolet light, a phosphor layer for converting ultraviolet light into visible light may be provided on the outer side of the electrode layer. The phosphor layer may be a layer containing a known fluorescent component capable of converting ultraviolet rays into visible light, and is not particularly limited. For example, preferable is such a configuration that a fluorescent component that becomes excited by ultraviolet light and emits blue light, a fluorescent component that becomes excited by ultraviolet light and emits blue to green light, and a fluorescent component that becomes excited by ultraviolet light and emits red light are allowed to be concomitantly present to obtain white light as a mixed color. Preferable combinations of such fluorescent components include $(Ca,Sr)_5(PO_4)_3Cl:Eu$, $BaMgAl_{10}O_{17}:Eu$ and Mn, and $Y_2O_3S:Eu$, and it is preferable to disperse these components in a resin such as silicone resin to form a phosphor layer. Such fluorescent components are not limited to components exemplified above, and other ultraviolet-excited phosphors such as yttrium aluminum garnet (YAG), silicate phosphors, and oxynitride-based phosphors may be combined.

On the other hand, when the light emitting functional layer 14 can emit blue light, a phosphor layer for converting blue light into yellow light may be provided on the outer side of the electrode layer. The phosphor layer may be a layer containing a known fluorescent component capable of converting blue light into yellow light, and is not particularly limited. For example, it may be a combination with a phosphor that emits yellow light, such as YAG. Accordingly, a pseudo-white light source can be obtained because blue light that has passed through the phosphor layer and yellow light from the phosphor are complementary. The phosphor layer may be configured to perform both conversion of ultraviolet light into visible light and conversion of blue light into yellow light by including both a fluorescent component that converts blue into yellow and a fluorescent component that converts ultraviolet light into visible light.

Light Emitting Device

A high-quality light emitting device can be produced with the above-described light emitting device composite substrate of the present invention. Neither the structure of the light emitting device including the composite substrate of the present invention nor the production method therefor is particularly limited, and a user may perform suitable processing on the composite substrate to produce the light emitting device.

(1) Horizontally-Structured Light Emitting Device

Figure 2:
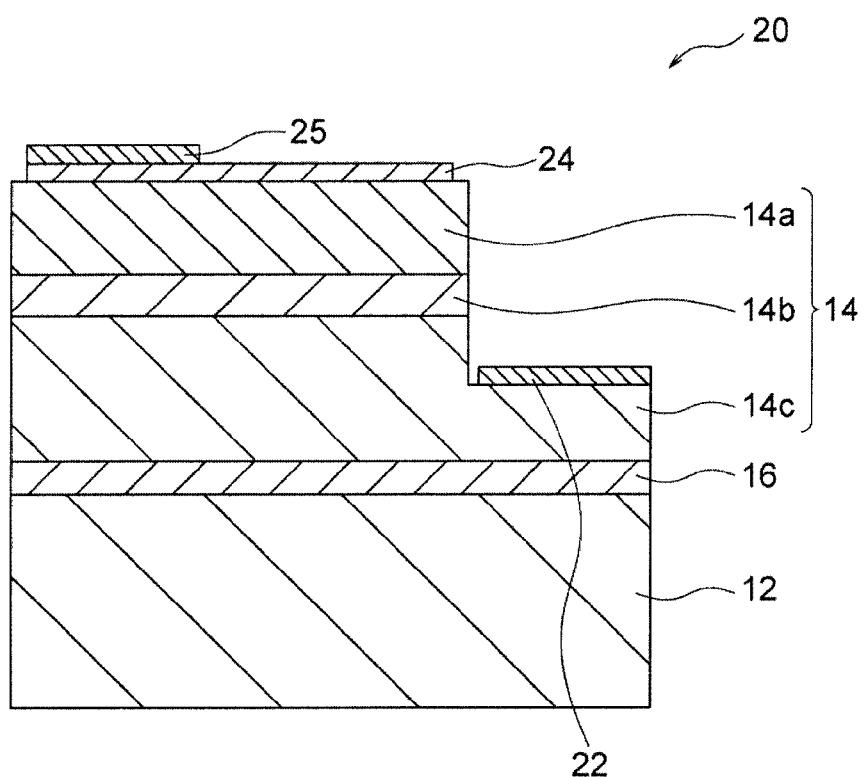
FIG. 2 is a schematic cross-sectional diagram showing one example of a horizontally-structured light emitting device produced with the composite substrate for light emitting devices of the present invention.

By using the composite substrate of the present invention, it is possible to produce a light emitting device with a so-called horizontal structure, in which an electric current flows not only in the direction normal to the light emitting functional layer 14 but also in the horizontal plane direction thereof. FIG. 2 shows one example of a horizontally-structured light emitting device. The light emitting device 20 shown in FIG. 2 is produced with the composite substrate 10. Specifically, a translucent anode 24 is provided on the top surface of the light emitting functional layer 14 (the top surface of the p-type layer 14a in the illustrated example) of the composite substrate 10, and optionally an anode pad 25 is provided on a part of the translucent anode 24. On the other hand, photolithography and etching (preferably reactive ion etching (RIE)) are performed on another part of the light emitting functional layer 14 to partially expose the n-type layer 14c, and a cathode 22 is provided on the exposed portion. In this way, the use of the composite substrate of the present invention enables a high-performance light emitting device to be produced merely by simple processing. As described above, an electrode layer and/or a phosphor layer may be provided on the composite substrate 10 in advance, and in such a case, a high-performance light emitting device can be produced through fewer steps.

(2) Vertically-Structured Light Emitting Device

Figure 3:
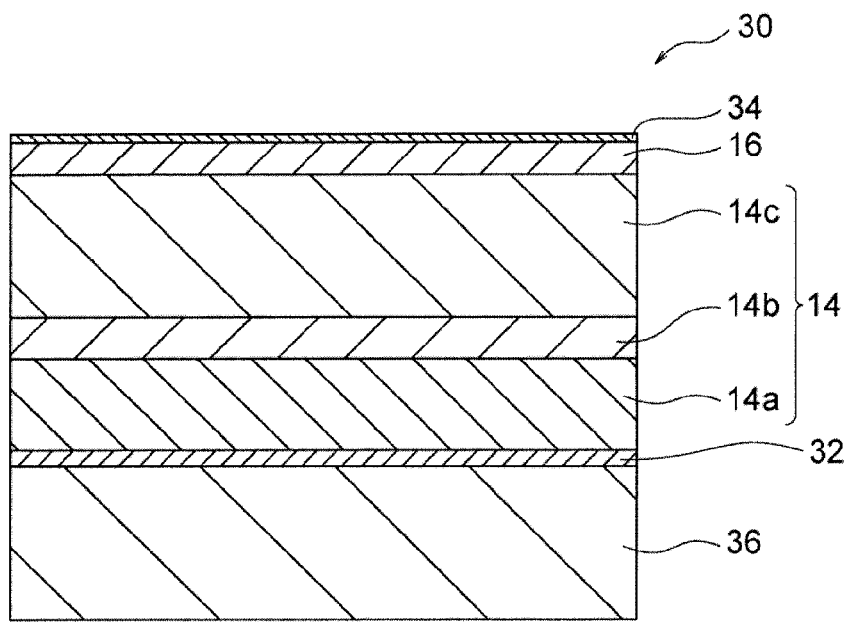
FIG. 3 is a schematic cross-sectional diagram showing one example of a vertically-structured light emitting device produced with the composite substrate for light emitting devices of the present invention.

Moreover, by using the composite substrate of the present invention, it is possible to produce a light emitting device with a so-called vertical structure, in which an electric current flows in the direction normal to the light emitting functional layer 14. The composite substrate 10 of the present invention includes an insulating polycrystalline alumina sintered body as the substrate 12, and it is therefore not possible to provide an electrode on the substrate 12 side without modification, and is thus not possible to form a vertically-structured light emitting device. However, a vertically-structured light emitting device can be produced by joining the composite substrate 10 and a mounting substrate and then removing the substrate 12. FIG. 3 shows an example of such a vertically-structured light emitting device. FIG. 3 shows a light emitting device 30 produced with the composite substrate 10. Specifically, an anode layer 32 is provided in advance on the outermost surface of the composite substrate 10 as necessary (the top surface of the p-type layer 14a in the illustrated example). Then, the anode layer 32 provided on the outermost surface of the light emitting functional layer 14 of the composite substrate 10 and a separately provided substrate 36 (hereinafter referred to as a mounting substrate 36) are joined. Then, the substrate 12 is removed by a known method such as grinding, laser lift-off, or etching. Finally, a cathode layer 34 is provided on the surface of the buffer layer 16 (or the light emitting functional layer 14 when there is no buffer layer 16) exposed by removing the substrate 12. In the case of adopting such a structure, it is necessary to impart electrical conductivity to the buffer layer 16, for example, by doping it with a p-type or n-type dopant. In this way, it is possible to obtain a light emitting device 30 having the light emitting functional layer 14 on the mounting substrate 36. The type of the mounting substrate 36 is not particularly limited, and when the mounting substrate 36 is electrically conductive, it is also possible to create the light emitting device 30 having a vertical structure in which the mounting substrate 36 itself serves as an electrode. As long as the light emitting functional layer 14 is not affected by diffusion or the like, the mounting substrate 36 in this case may be a semiconductor material doped with a p-type or n-type dopant or may be a metal material. The light emitting functional layer 14 may produce heat as it emits light, the temperature of the light emitting functional layer 14 and the surrounding part can be kept low when the mounting substrate 36 is made of a highly heat-conductive material.

Moreover, a thick buffer layer enables a vertically-structured light emitting device to be produced without a mounting substrate. Specifically, after the buffer layer 16 is formed to such an extent that the buffer layer 16 can support itself (e.g., to a thickness of 20 μm or greater), a composite substrate provided with the light emitting functional layer 14 is produced. Also, the anode layer 32 is provided on the outermost surface of the composite substrate 10 as necessary. Then, the substrate 12 is removed by a known method such as grinding, laser lift-off, or etching. Finally, the cathode layer 34 is provided on the surface of the buffer layer 16 exposed by removing the substrate 12. In the case of adopting such a structure, it is necessary to impart electrical conductivity to the buffer layer 16, for example, by doping it with a p-type or n-type dopant. In this way, it is possible to obtain the light emitting device 30 that is self-supporting and has the light emitting functional layer 14.

It is particularly preferable that the buffer layer 16 serves as the above-described grain diameter increasing layer. In this case, from the viewpoint of enhancing luminous efficiency, the buffer layer 16 preferably has a large aspect ratio $T/D_T$, wherein the aspect ratio $T/D_T$ is defined as the ratio of the thickness T of the buffer layer 16 to the cross-sectional average diameter $D_T$ of semiconductor single crystal grains constituting the top surface of the buffer layer 16 as determined at the top surface, the top surface facing toward the light emitting functional layer 14. The aspect ratio $T/D_T$ is more preferably 0.7 or greater, even more preferably 1.0 or greater, and particularly preferably 3 or greater. Such an aspect ratio is preferable from the viewpoint of increasing luminous efficiency in the case of LEDs. As for the cause of increased luminous efficiency, it is considered that high-aspect-ratio grains used for the buffer layer 16 result in a low defect density in the light emitting functional layer 14 provided thereon, an increased light extraction efficiency, and so on, but details thereof are not clear.

As described so far, from the viewpoint of increasing luminous efficiency, it is preferable that (1) a grain diameter increasing layer is provided in a region located more toward the oriented polycrystalline alumina substrate 12 than the layer or the interface that actually emits light such as the active layer 14b or the p-n junction interface is located, and the ratio between the cross-sectional particle diameter at the top surface and the cross-sectional particle diameter at the bottom surface of grains constituting the grain diameter increasing layer has a suitable value; (2) the cross-sectional average diameter at the outermost surface of the light emitting functional layer 14 is large; and (3) the aspect ratio of grains constituting the grain diameter increasing layer (e.g., the buffer layer 16) is large.

EXAMPLES

The present invention will now be more specifically described by way of the following examples.

Example 1

(1) Production of C-plane Oriented Alumina Substrate

As a raw material, a plate-shaped alumina powder (manufactured by Kinsei Matec Co., Ltd., grade 00610) was provided. 7 parts by weight of a binder (polyvinyl butyral: lot number BM-2, manufactured by Sekisui Chemical Co., Ltd.), 3.5 parts by weight of a plasticizer (DOP: di(2-ethylhexyl) phthalate, manufactured by Kurogane Kasei Co., Ltd.), 2 parts by weight of a dispersing agent (Rheodol SP-O30, manufactured by Kao Corporation), and a dispersion medium (2-ethylhexanol) were mixed with 100 parts by weight of the plate-shaped alumina particles. The amount of the dispersion medium was adjusted so that the slurry viscosity was 20000 cP. The slurry prepared as above was shaped into a sheet form on a PET film by a doctor blade method so as to have a dry thickness of 20 μm. The resulting tape was cut into circles having a diameter of 50.8 mm (2 inches), then 150 pieces were stacked and placed on an Al plate having a thickness of 10 mm, and then vacuum packing was performed. This vacuum pack was subjected to isostatic pressing in hot water at 85° C. under a pressure of 100 kgf/cm², and a disc-shaped green body was obtained.

The resulting green body was placed in a degreasing furnace and degreased at 600° C. for 10 hours. The resulting degreased body was fired in a hot press at 1600° C. for 4 hours under a surface pressure of 200 kgf/cm² in nitrogen using a graphite mold. The resulting sintered body was re-fired at 1700° C. for 2 hours under a gas pressure of 1500 kgf/cm² in argon by hot isostatic pressing (HIP).

The sintered body obtained in this way was fixed to a ceramic surface plate and ground to #2000 using a grinding wheel to flatten the plate surface. Next, the plate surface was smoothed by lapping using diamond abrasive grains to obtain an oriented alumina sintered body having a diameter of 50.8 mm (2 inches) and a thickness of 1 mm as an oriented alumina substrate. Flatness was improved by reducing the size of abrasive grains from 3 μm to 0.5 μm in a stepwise manner. The average roughness Ra after processing was 1 nm.

(2) Evaluation of Oriented Alumina Substrate (Determination of Degree of Orientation)

To check the degree of orientation of the resulting oriented alumina substrate, the degree of orientation at the c-plane, which is the measurement-target crystal plane in this experimental example, was measured by XRD. An XRD profile was obtained through irradiating the plate surface of the oriented alumina substrate with X rays within the range of 2θ=20-70° C. using an XRD apparatus (RINT-TTR III manufactured by Rigaku Corporation). The degree of c-plane orientation was calculated according to the following formulae. As a result, the value of the degree of c-plane orientation in this experimental example was 97%.

[Mathematical Formula 2]

$$\text{Degree of Orientation } [\%] = \frac{p - p_0}{1 - p_0} \times 100$$

$$p_0 = \frac{I_0(006)}{\Sigma I_0(hkl)}$$

$$p = \frac{I_s(006)}{\Sigma I_s(hkl)}$$

where $I_0(hkl)$ and $I_s(hkl)$ are the diffraction intensities (integral values) from the (hkl) planes in ICDD No. 461212 and a sample, respectively.

(Determination of Grain Diameter of Sintered Body Grains)

Concerning the sintered body grains of the oriented alumina substrate, the average grain diameter at the plate surface was measured by the following method. The plate surface of the resulting oriented alumina substrate was polished and subjected to thermal etching at 1550° C. for 45 minutes, and then an image was taken with a scanning electron microscope. The visual field range was determined in such a way that each straight line drawn diagonally in the obtained image crossed 10 to 30 grains. The average grain diameter at the plate surface was determined by diagonally drawing two straight lines on the obtained image, taking the average of the line segment lengths inside all grains crossed by the straight lines, and multiplying the average by 1.5. As a result, the average grain diameter at the plate surface was 100 μm.

(3) Production of Light Emitting Device Substrate (3a) Formation of Seed Crystal Layer Next, a seed crystal layer was formed on the processed oriented alumina substrate using MOCVD. Specifically, a 40 nm thick low-temperature GaN layer was deposited at 530° C., and then a GaN film having a thickness of 3 μm was laminated at 1050° C. to obtain a seed crystal substrate.

(3b) Formation of GaN Buffer Layer by Na Flux

The seed crystal substrate produced in the above process was placed in the bottom of a cylindrical, flat-bottomed alumina crucible having an inner diameter of 80 mm and a height of 45 mm, and then the crucible was filled with a melt composition in a glovebox. The composition of the melt composition is as follows.

Metal Ga: 60 g

Metal Na: 60 g

This alumina crucible was put in a vessel made of a refractory metal and sealed, and then placed on a rotatable rack of a crystal growth furnace. After the temperature and the pressure were increased to 870° C. and 4.0 MPa in a nitrogen atmosphere, the melt was maintained for 10 hours while being rotated and stirred, and gallium nitride crystals were allowed to grow as a buffer layer. After the end of crystal growth, the growth vessel was cooled slowly back to room temperature for 3 hours, and then the growth vessel was taken out from the crystal growth furnace. The melt composition remaining in the crucible was removed using ethanol, and a sample in which gallium nitride crystals grew was recovered. In the resulting sample, gallium nitride crystals grew on the entire surface of the 50.8 mm (2 inches) seed crystal substrate, and the crystal thickness was about 0.1 mm. No cracks were observed.

The resulting oriented alumina substrate was fixed to a ceramic surface plate, the plate surface of gallium nitride crystals on the oriented alumina substrate was ground and flattened with #600 and #2000 grinding wheels. Next, the plate surface of gallium nitride crystals was smoothed by lapping using diamond abrasive grains. At this time, flatness was improved by reducing the size of abrasive grains from 3 μm to 0.1 μm in a stepwise manner. The average roughness Ra at the plate surface of gallium nitride crystals after processing was 0.2 nm. In this way, a substrate was obtained in which a gallium nitride crystal layer having a thickness of about 50 μm was formed on an oriented alumina substrate. In this example, such a gallium nitride buffer layer was formed in order to enhance the crystallinity of a light emitting functional layer, which will be described below, but the buffer layer may be omitted depending on the desired properties and the intended use. Also, electrical conductivity may be provided by doping the gallium nitride buffer layer with germanium, silicon, oxygen, or the like.

(3c) Formation of Light Emitting Functional Layer by MOCVD and Determination of Cross-sectional Average Diameter Using MOCVD, a 3 μm thick n-GaN layer doped to give a Si atom concentration of $5 \times 10^{18}/cm^3$ was deposited at 1050° C. as an n-type layer on the substrate. Next, a multiple quantum well layer was deposited at 750° C. as an active layer. Specifically, five 2.5 nm thick InGaN well layers and six 10 nm thick GaN barrier layers were alternately stacked. Next, a 200 nm thick p-GaN doped to give a Mg atom concentration of $1 \times 10^{19}/cm^3$ was deposited at 950° C. as a p-type layer. Thereafter, the sample was taken out from the MOCVD apparatus, 800° C. heat treatment was performed for 10 minutes in a nitrogen atmosphere as activation treatment of Mg ions of the p-type layer, and thus a light emitting device substrate was obtained.

(Determination of Cross-Sectional Average Diameter of Light Emitting Functional Layer)

In order to measure the cross-sectional average diameter of GaN single crystal grains at the outermost surface of the light emitting functional layer thus formed, an image of the top surface of the light emitting functional layer was taken with a scanning electron microscope. The visual field range was determined in such a way that each straight line drawn diagonally in the obtained image crossed 10 to 30 columnar structures. The cross-sectional average grain diameter of GaN single crystal grains at the outermost surface of the light emitting functional layer was determined by diagonally drawing two straight lines on the obtained image, taking the average of the line segment lengths inside all grains crossed by the straight lines, and multiplying the average by 1.5. As a result, the cross-sectional average diameter was about 100 μm. In this example, it was possible to clearly identify the interface of columnar structures on the scanning microscope image of the top surface, but the above measurement may be carried out after emphasizing the interface by thermal etching or chemical etching.

(4) Production and Evaluation of Horizontally-Structured Light Emitting Device

A part of the n-type layer was exposed by performing photolithography and RIE on the light emitting functional layer side of the produced light emitting device substrate. Subsequently, using photolithography and vacuum deposition, Ti/Al/Ni/Au films as a cathode were patterned on the exposed portion of the n-type layer in a thickness of 15 nm, 70 nm, 12 nm, and 60 nm, respectively. Thereafter, to improve ohmic contact characteristics, 700° C. heat treatment was performed in a nitrogen atmosphere for 30 seconds. Furthermore, using photolithography and vacuum deposition, Ni/Au films were patterned as a translucent anode on the p-type layer in a thickness of 6 nm and 12 nm, respectively. Thereafter, to improve ohmic contact characteristics, 500° C. heat treatment was performed in a nitrogen atmosphere for 30 seconds. Furthermore, using photolithography and vacuum method, Ni/Au films that served as an anode pad were patterned in a thickness of 5 nm and 60 nm, respectively, on a partial area of the top surface of the Ni/Au films as a translucent anode. The wafer obtained in this way was cut into a chip and, further, furnished with a lead frame to provide a horizontally-structured light emitting device.

(Evaluation of Light Emitting Device)

When electricity was applied across the cathode and the anode, and I-V measurement was performed, rectifying characteristics were confirmed. Moreover, with an electric current flowing in the forward direction, emission of light having a wavelength of 450 nm was confirmed.

Example 2

(1) Production of light emitting device substrate
(1a) Formation of GaN buffer layer on seed crystal substrate by Na flux A seed crystal substrate having a 3 μm thick GaN film stacked on an oriented alumina substrate was produced as in (1) to (3) of Example 1. A GaN buffer layer was formed on this seed crystal substrate as in (3b) of Example 1 except that the composition of the melt composition was as follows.
Metal Ga: 60 g
Metal Na: 60 g
Germanium tetrachloride: 1.85 g In the resulting sample, germanium-doped gallium nitride crystals grew on the entire surface of the 50.8 mm (2 inches) seed crystal substrate, and the crystal thickness was about 0.1 mm. No cracks were observed. Then, the sample was processed by the same method as (3b) of Example 1 to obtain a substrate in which a germanium-doped gallium nitride crystal layer having a thickness of about 50 μm was formed on an oriented alumina substrate.

(Determination of Volume Resistivity)

The in-plane volume resistivity of the germanium-doped gallium nitride crystal layer was measured using a Hall effect analyzer. As a result, the volume resistivity was $1 \times 10^{-2}$ Ω·cm.

(1b) Formation of Light Emitting Functional Layer by MOCVD and Determination of Cross-Sectional Average Diameter By a method similar to (3c) of Example 1, a light emitting functional layer was formed on the substrate, and a light emitting device substrate was thus obtained. Measurement of the cross-sectional average diameter of the light emitting functional layer by a method similar to (3c) of Example 1 resulted in an average grain diameter of about 100 μm at the plate surface of the light emitting functional layer.

(2) Production and Evaluation of Vertically-Structured Light Emitting Device

For the light emitting device substrate produced in this example, a Ag film was deposited to a thickness of 200 nm as a reflective anode layer onto the p-type layer by vacuum deposition. Thereafter, to improve ohmic contact characteristics, 500° C. heat treatment was performed in a nitrogen atmosphere for 30 seconds. Next, using Sn—Ag soldering, the Ag film serving as a reflective anode layer on the p-type layer and a separately provided 50.8 mm (2 inches) p-type Si substrate (a mounting substrate) having a thickness of 280 μm were attached to each other, and joined by reflowing at 250° C. for 60 seconds. Next, the oriented alumina substrate portion was removed by grinding it with a grinding wheel to expose the GaN buffer layer composed of germanium-doped gallium nitride. Next, using photolithography and vacuum deposition, Ti/Al/Ni/Au films as a cathode were patterned on the GaN buffer layer in a thickness of 15 nm, 70 nm, 12 nm, and 60 nm, respectively. The cathode was patterned into a shape having an opening so that light can be extracted from a portion where the electrode was not formed. Thereafter, to improve ohmic contact characteristics, 700° C. heat treatment was performed in a nitrogen atmosphere for 30 seconds. The wafer obtained in this way was cut into a chip and, further, furnished with a lead frame to obtain a vertically-structured light emitting device.

(Evaluation of Light Emitting Device)

When electricity was applied across the cathode and the anode, and I-V measurement was performed, rectifying characteristics were confirmed. Moreover, with an electric current flowing in the forward direction, emission of light having a wavelength of 450 nm was confirmed.

Example 3

(1) Production of Light Emitting Device Substrate
(1a) Formation of p-type Layer by MOCVD As in (1) to (3) of Example 1, a substrate was obtained in which a gallium nitride crystal layer having a thickness of about 50 μm was formed on an oriented alumina substrate. Next, using MOCVD, a 200 nm thick p-GaN doped to have a Mg atom concentration of $1 \times 10^{19}/cm^3$ was deposited at 950° C. as a p-type layer on the substrate. Thereafter, the sample was taken out from the MOCVD apparatus, and 800° C. heat treatment was performed for 10 minutes in a nitrogen atmosphere as activation treatment of Mg ions of the p-type layer.

(1b) Formation of n-type Layer by RS-MBE and Hydrothermal Method
(1b-1) Formation of Seed Crystal Layer by RS-MBE Using an RS-MBE (radical source molecular beam epitaxy) apparatus, zinc (Zn) and aluminum (Al), which are metal materials, were irradiated in a Knudsen cell and supplied onto the p-type layer. Oxygen (O), which is a gaseous material, was supplied as an oxygen radical in an RF radical generator, using $O_2$ gas as a raw material. As for the purity of various raw materials that were used, the purity for Zn was 7 N while that for $O_2$ was 6 N. The substrate was heated to 700° C. using a resistance heater, and a film of an Al-doped n-ZnO seed crystal layer having a thickness of 20 nm was formed while controlling the flux of various gas sources so that the Al concentration was $2 \times 10^{18}/cm^3$ and the ratio of the Zn atom concentration to the O atom concentration was 1 to 1 in the film.

(1c-2) Formation of n-type Layer by Hydrothermal Method

Zinc nitrate was dissolved in pure water so as to be 0.1 M to provide solution A. Next, 1 M aqueous ammonia was provided as solution B. Next, aluminium sulfate was dissolved in pure water so as to be 0.1 M to provide solution C. These solutions were mixed and stirred so that the volume ratio solution A:solution B:solution C was 1:1:0.01, thereby providing an aqueous growth solution.

The oriented alumina substrate on which a film of a seed crystal layer had been formed was placed upright in 1 liter of the aqueous growth solution. Next, a waterproofed ceramic heater and a magnetic stirrer were placed in the aqueous solution, the aqueous solution was placed in an autoclave to perform hydrothermal treatment at 270° C. for 3 hours, and a ZnO layer was precipitated on the seed crystal layer. The oriented alumina substrate on which a ZnO layer had been precipitated was washed with pure water, and then annealing treatment was performed at 500° C. in air to form an Al-doped n-ZnO layer having a thickness of about 3 μm. Neither pores nor cracks were detected in the sample, and electroconductivity of the ZnO layer was confirmed by using a tester. Measurement of the cross-sectional average diameter of the light emitting functional layer by a method similar to (3c) of Example 1 resulted in an average grain diameter of about 100 μm at the plate surface of the light emitting functional layer.

(2) Production and Evaluation of Horizontally-Structured Light Emitting Device

Using photolithography and vacuum deposition, Ti/Al/Ni/Au films as a cathode were patterned on the n-type layer in a thickness of 15 nm, 70 nm, 12 nm, and 60 nm, respectively, on the light emitting functional layer side of the light emitting device substrate produced in this Example. The cathode was patterned into a shape having an opening so that light can be extracted from a portion where the electrode was not formed. Thereafter, to improve ohmic contact characteristics, 700° C. heat treatment was performed in a nitrogen atmosphere for 30 seconds. Furthermore, a part of the p-type layer was exposed by performing photolithography and RIE. Subsequently, using photolithography and a vacuum deposition method, Ni/Au films were patterned as an anode on the exposed portion of the p-type layer in a thickness of 5 nm and 100 nm, respectively. Thereafter, to improve ohmic contact characteristics, 500° C. heat treatment was performed in a nitrogen atmosphere for 30 seconds. The wafer obtained in this way was cut into a chip and, further, furnished with a lead frame to provide a horizontally-structured light emitting device.

(Evaluation of Light Emitting Device)

When electricity was applied across the anode and the cathode, and I-V measurement was performed, rectifying characteristics were confirmed. Moreover, with an electric current flowing in the forward direction, emission of light having a wavelength of about 380 nm was confirmed.

Example 4

(1) Production of Light Emitting Device Substrate
(1a) Formation of p-type Layer by MOCVD As in (1) to (3) of Example 1, a substrate was obtained in which a gallium nitride crystal layer having a thickness of about 50 μm was formed on an oriented alumina substrate. Next, using MOCVD, a 200 nm thick p-GaN doped to give a Mg atom concentration of $1 \times 10^{19}/cm^3$ was deposited at 950° C. as a p-type layer on the substrate. Thereafter, the sample was taken out from the MOCVD apparatus, and 800° C. heat treatment was performed for 10 minutes in a nitrogen atmosphere as activation treatment of Mg ions of the p-type layer.

(1b) Formation of Active Layer by RS-MBE

Using an RS-MBE (radical source molecular beam epitaxy) apparatus, zinc (Zn) and cadmium (Cd), which are metal materials, were irradiated in a Knudsen cell and supplied onto the p-type layer. Oxygen (O), which is a gaseous material, was supplied as an oxygen radical with an RF radical generator in which $O_2$ gas was used as a raw material. As for the purity of various raw materials that were used, the purity for Zn and Cd was 7N while that for $O_2$ was 6 N. The substrate was heated to 700° C. using a resistance heater, and a film of an active layer having a thickness of 1.5 nm was formed while controlling the flux of various gas sources so as to provide a $Cd_{0.2}Zn_{0.8}O$ layer.

(1c) Formation of n-type Layer by RF Magnetron Sputtering

Next, a 500 nm thick film of an n-type ZnO layer was formed as an n-type layer on the active layer using RF magnetron sputtering. For film formation, a ZnO target to which 2 parts by weight of Al had been added was used, and film formation conditions included a pure Ar atmosphere, a pressure of 0.5 Pa, an applied power of 150 W, and a film formation time of 5 minutes. Measurement of the cross-sectional average diameter of the light emitting functional layer by a method similar to (3c) of Example 1 resulted in an average grain diameter of about 100 μm at the plate surface of the light emitting functional layer.

(2) Production and Evaluation of Horizontally-Structured Light Emitting Device

Using photolithography and vacuum deposition, Ti/Al/Ni/Au films as a cathode were patterned on the n-type layer in a thickness of 15 nm, 70 nm, 12 nm, and 60 nm, respectively, on the light emitting functional layer side of the light emitting device substrate produced in this Example. The cathode was patterned into a shape having an opening so that light can be extracted from a portion where the electrode was not formed. Thereafter, to improve ohmic contact characteristics, 700° C. heat treatment was performed in a nitrogen atmosphere for 30 seconds. Furthermore, a part of the p-type layer was exposed by performing photolithography and RIE. Subsequently, using photolithography and vacuum deposition, Ni/Au films were patterned as an anode on the exposed portion of the p-type layer in a thickness of 5 nm and 60 nm, respectively. Thereafter, to improve ohmic contact characteristics, 500° C. heat treatment was performed in a nitrogen atmosphere for 30 seconds. The wafer obtained in this way was cut into a chip and, further, furnished with a lead frame to provide a horizontally-structured light emitting device.

(Evaluation of Light Emitting Device)

When electricity was applied across the anode and the cathode, and I-V measurement was performed, rectifying characteristics were confirmed. Moreover, with an electric current flowing in the forward direction, emission of light having a wavelength of about 400 nm was confirmed.

Example 5

(1) Production of c-plane Oriented Alumina Sintered Body

A disc-shaped green body was obtained as in (1) of Example 1. The resulting green body was placed in a degreasing furnace and degreased at 600° C. for 10 hours. The resulting degreased body was fired in a hot press at 1700° C. for 4 hours under a surface pressure of 200 kgf/cm² in nitrogen using a graphite mold.

The sintered body obtained in this way was fixed to a ceramic surface plate and ground to #2000 using a grinding wheel to flatten the plate surface. Next, the plate surface was smoothed by lapping using diamond abrasive grains to obtain an oriented alumina sintered body having a diameter of 50.8 mm (2 inches) and a thickness of 1 mm as an oriented alumina substrate. Flatness was improved by reducing the size of abrasive grains from 3 μm to 0.5 μm in a stepwise manner. The average roughness Ra after processing was 4 nm. Determination of the degree of c-plane orientation and the average grain diameter at the plate surface by methods similar to Example 1 resulted in a degree of c-plane orientation of 99% and an average grain diameter of 18 μm.

(2) Formation of GaN Buffer Layer by Na Flux

A seed crystal substrate having a 3 μm thick GaN film stacked on the oriented alumina substrate was produced by a method similar to (3a) of Example 1. A Ge-doped GaN film was formed on this seed crystal substrate as in Example 2(1a) except that the retention time was 20 hours. In the resulting sample, Ge-doped gallium nitride crystals grew on the entire surface of the 50.8 mm (2 inches) seed crystal substrate, and the crystal thickness was about 0.2 mm. No cracks were observed. Then, the sample was processed by the same method as Example 1(3b) to obtain a substrate in which a buffer layer having a thickness of about 50 μm composed of germanium-doped gallium nitride crystals was formed on an oriented alumina substrate. The average roughness Ra at the plate surface of gallium nitride crystals after processing was 0.2 nm.

(EBSD Measurement of Cross-Section of Ge-Doped GaN Buffer Layer)

Figure 5:
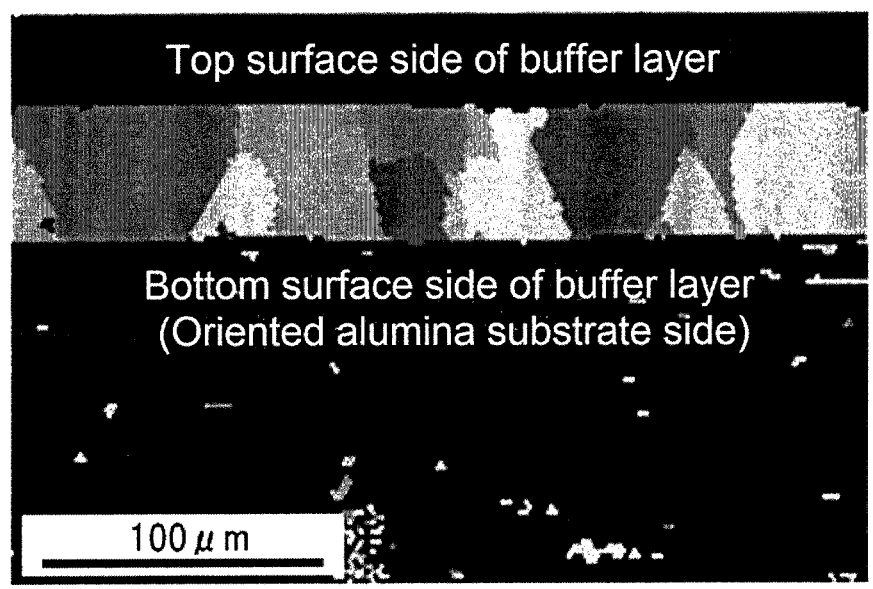
FIG. 5 is an inverse pole figure map of the cross section of gallium nitride crystals (a buffer layer) obtained in Example 5.
Figure 5:
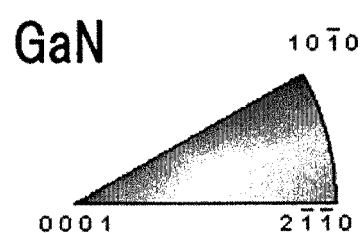
Figure 6:
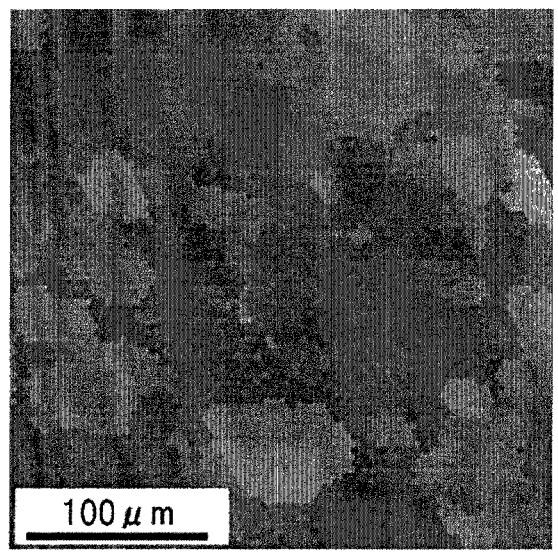
FIG. 6 is an inverse pole figure map of the top surface of gallium nitride crystals (a buffer layer) obtained in Example 5.
Figure 6:
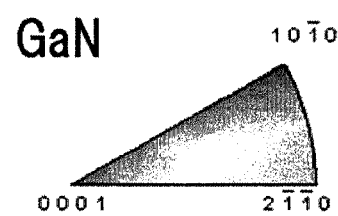
Figure 7:
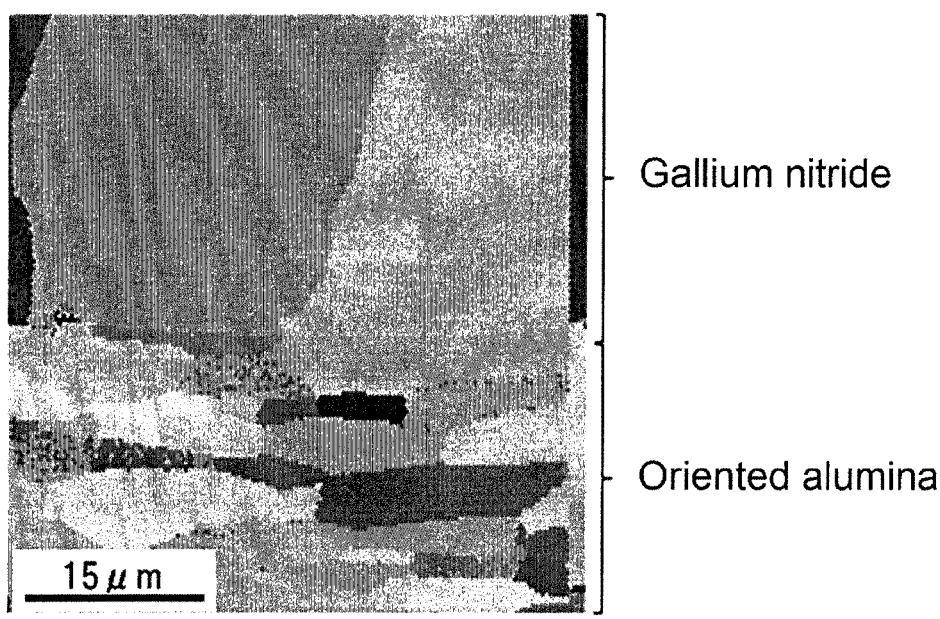
FIG. 7 is a crystal grain map showing the vicinity of the interface between gallium nitride crystals (a buffer layer) and an oriented alumina substrate obtained in Example 5.

The sample obtained in this way was cut to expose the plane perpendicular to the plate surface, the plane was polished using a CP polisher (manufactured by JEOL Ltd., IB-09010CP), and then inverse pole figure mapping of the GaN buffer layer was performed with an electron-beam backscattering diffractometer (EBSD) (manufactured by TSL Solutions). FIG. 5 shows an inverse pole figure map. FIG. 6 shows an inverse pole figure map obtained at the plate surface (top surface), and FIG. 7 shows a crystal grain map image in which the interface between the oriented alumina substrate and the gallium nitride crystals (the buffer layer) is enlarged. It can be understood from FIG. 5 that the gallium nitride crystals constitute a grain diameter increasing layer having a larger grain diameter on the top surface side (the side opposite to the oriented alumina substrate) than on the side closer to the oriented alumina substrate, and the shape of the gallium nitride crystals, being trapezoidal, triangular, or the like on the cross-sectional image, is not completely columnar. Moreover, it can be understood that, as the film thickens, there are grains that develop to have an increased grain diameter and reach the top surface, and grains that do not develop to reach the top surface. FIG. 6 shows that the c-plane of each grain constituting the gallium nitride crystals is mostly oriented in the normal direction. Moreover, it can be understood from FIG. 7 that gallium nitride crystal grains grow using, as a starting point, crystal grains constituting the oriented alumina substrate that serves as a base. Although the cause of a growth behavior as shown in FIG. 5 is not clear, it is considered that growth has progressed so that fast-growing grains cover slow-growing grains as conceptually shown in FIG. 8. Therefore, among the gallium nitride grains constituting the gallium nitride crystals, grains exposed on the top surface side connect to the bottom surface without intervention of a grain boundary, but grains exposed on the bottom surface side include grains which have ceased to grow halfway.

Next, the vicinity of the top surface and the vicinity of the bottom surface of the CP-polished GaN buffer layer were observed with a scanning electron microscope. The measurement visual field was determined so as to include 10 to 30 GaN grains constituting the buffer layer. The cross-sectional average diameter of GaN single crystal grains on the top surface side or the bottom surface side was determined by taking the average of the line segment lengths inside individual GaN grains in the interface portion in the obtained image and multiplying the average by 1.5. As a result, the cross-sectional average diameter of the top surface was about 50 μm, and the cross-sectional average diameter of the bottom surface was about 18 μm. Thus, the cross-sectional average diameter was larger at the top surface than at the bottom surface, and the $D_T/D_B$ of this grain diameter increasing layer was about 2.8, which is the ratio of the cross-sectional average diameter at the top surface $D_T$ to the cross-sectional average diameter at the bottom surface $D_B$. The aspect ratio $T/D_T$ was about 1.0, which is defined as the ratio of the thickness T of the grain diameter increasing layer to the cross-sectional average diameter $D_T$ of the grains constituting the surface facing the side opposite to the oriented polycrystalline alumina sintered body substrate. The above measurement may be carried out after emphasizing the interface by thermal etching or chemical etching. The volume resistivity was measured by a method similar to (1a) of Example 2, and the volume resistivity was $1\times10^{-2}$ Ω·cm.

(3) Production and Evaluation of Vertically-Structured Light Emitting Device

By a method similar to (3c) of Example 1, a light emitting functional layer was formed on a substrate provided with a buffer layer, and a light emitting device substrate was thus obtained. Measurement of the cross-sectional average diameter of the light emitting functional layer by a method similar to (3c) of Example 1 resulted in an average grain diameter of about 50 μm at the plate surface of the light emitting functional layer. A vertically-structured light emitting device was produced by a method similar to Example 2(2), and when I-V measurement was performed, rectifying characteristics were confirmed. Moreover, with an electric current flowing in the forward direction, emission of light having a wavelength of 450 nm was confirmed.

For reference, a gallium nitride buffer layer having a thickness of 20 μm was also provided by grinding the top surface side of a buffer layer produced as in (1) and (2) described above. At this time, the cross-sectional average diameter of single crystal grains at the outermost surface was about 35 μm; the $D_T/D_B$ was 1.9, which is the ratio of the cross-sectional average diameter at the top surface $D_T$ to the cross-sectional average diameter at the bottom surface $D_B$; and the aspect ratio $T/D_T$ was about 0.6. When a light emitting functional layer as above was produced with this sample to provide a vertically-structured light emitting device and then an electric current was allowed to flow in the forward direction, rectifying characteristics and an emission of light having a wavelength of 450 nm were both confirmed and also the luminance of emitted light was high to some extent, but the luminance of emitted light was lower than that of the aforementioned device.

Example 6

(1) Production of c-plane Oriented Alumina Sintered Body

A plate-shaped alumina powder (manufactured by Kinsei Matec Co., Ltd., grade 02025), a fine alumina powder (manufactured by Taimei Chemicals Co., Ltd., grade TM-DAR), and a magnesium oxide powder (manufactured by Ube Material Industries, Ltd., grade 500A) were provided as raw materials, and 5 parts by weight of the plate-shaped alumina powder, 95 weight of the fine alumina powder, and 0.025 weight of the magnesium oxide powder were mixed to obtain an alumina raw material. Next, 8 parts by weight of a binder (polyvinyl butyral: product name BM-2, manufactured by Sekisui Chemical Co., Ltd.), 4 parts by weight of a plasticizer (DOP: di(2-ethylhexyl) phthalate, manufactured by Kurogane Kasei Co., Ltd.), 2 parts by weight of a dispersing agent (Rheodol SP-O30, manufactured by Kao Corporation), and a dispersion medium (a mixture of xylene and 1-butanol in a weight ratio of 1:1) were mixed with 100 parts by weight of the alumina raw material. The amount of the dispersion medium was adjusted so that the slurry viscosity was 20000 cP. The slurry prepared as above was shaped into a sheet form on a PET film by a doctor blade method so as to have a thickness after drying of 100 μm. The resulting tape was cut into circles having a diameter of 50.8 mm (2 inches), then 30 pieces were stacked and placed on an Al plate having a thickness of 10 mm, and then vacuum packing was performed. This vacuum pack was subjected to isostatic pressing in hot water at 85° C. under a pressure of 100 kgf/cm², and a disc-shaped green body was obtained.

The resulting green body was placed in a degreasing furnace and degreased at 600° C. for 10 hours. The resulting degreased body was fired in a hot press at 1800° C. for 4 hours under a surface pressure of 200 kgf/cm² in nitrogen using a graphite mold.

The sintered body obtained in this way was fixed to a ceramic surface plate and ground to #2000 using a grinding wheel to flatten the plate surface. Next, the plate surface was smoothed by lapping using diamond abrasive grains to obtain an oriented alumina sintered body having a diameter of 50.8 mm (2 inches) and a thickness of 1 mm as an oriented alumina substrate. Flatness was improved by reducing the size of abrasive grains from 3 μm to 0.5 μm in a stepwise manner. The average roughness Ra after processing was 4 nm. Determination of the degree of c-plane orientation and the average grain diameter at the plate surface by methods similar to Example 1 resulted in a degree of c-plane orientation of 96% and an average grain diameter of about 20 μm.

(2) Formation of GaN Buffer Layer by Na Flux

A seed crystal substrate having a 3 μm thick GaN film stacked on the oriented alumina substrate was produced as in (3a) of Example 1. A Ge-doped GaN film was formed on this seed crystal substrate as in (1a) of Example 2 except that the retention time was 40 hours. In the resulting sample, Ge-doped gallium nitride crystals grew on the entire surface of the 50.8 mm (2 inches) seed crystal substrate, and the crystal thickness was about 0.4 mm. No cracks were observed.

Then, the sample was processed by the same method as (3b) of Example 1 to obtain a substrate in which a buffer layer having a thickness of about 260 μm composed of germanium-doped gallium nitride crystals was formed on an oriented alumina substrate. The average roughness Ra at the plate surface of gallium nitride crystals after processing was 0.2 nm.

(EBSD Measurement of Cross-Section of Ge-Doped GaN Buffer Layer)

Figure 8:
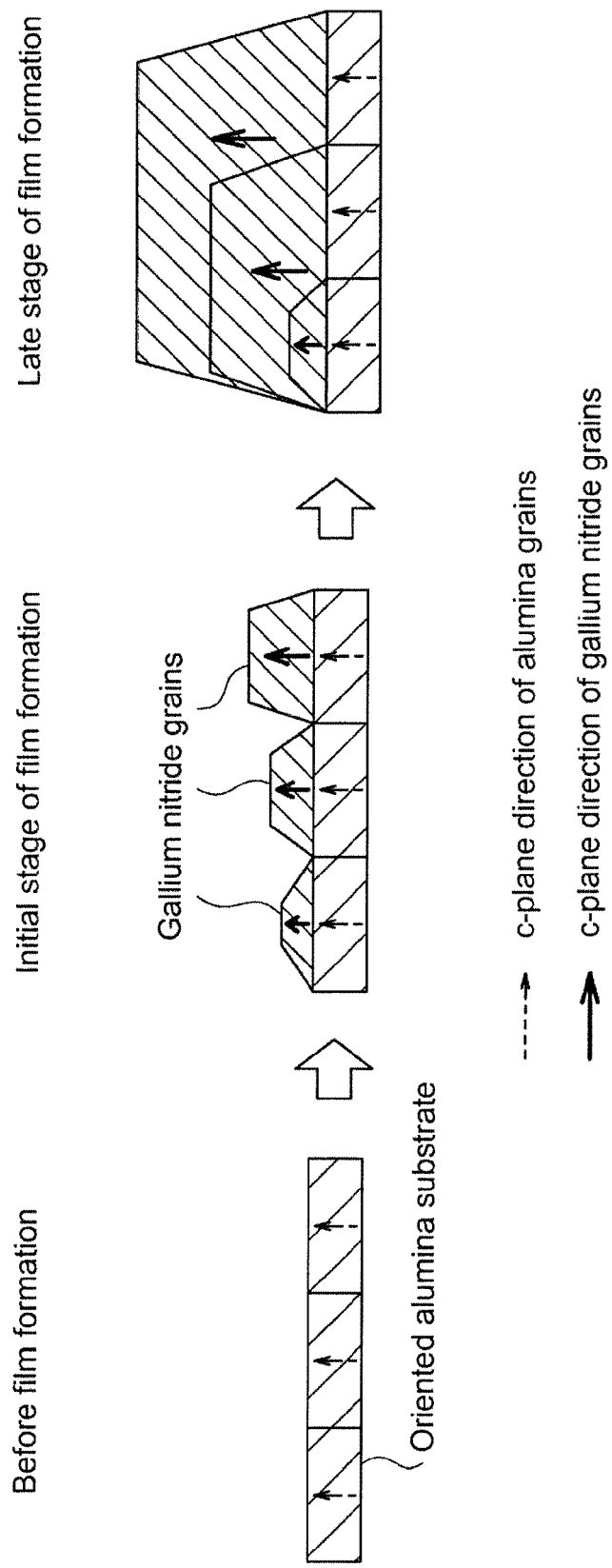
FIG. 8 shows conceptual diagrams of the growth behavior of gallium nitride crystals considered in Example 5.

Next, inverse pole figure mapping of the cross section of the GaN buffer layer was performed by a method similar to Example 5, and it was found that the gallium nitride crystals formed a grain diameter increasing layer having a larger grain diameter on the top surface side (the side opposite to the oriented alumina substrate) than on the side closer to the oriented alumina substrate, and the shape of the gallium nitride crystals, being trapezoidal, triangular, or the like on the cross-sectional image, was not completely columnar. Moreover, it was found that, as the film thickens, there are grains that develop to have an increased grain diameter and reach the top surface, and grains that do not develop to reach the top surface. Although the reason of such a growth behavior is not clear, such a behavior is considered to be a result of growth that progressed in such a manner that fast-growing grains covered slow-growing grains as shown in FIG. 8. Therefore, among the gallium nitride grains constituting the grain diameter increasing layer, grains exposed on the top surface side (the side opposite to the oriented alumina substrate) connect to the bottom surface without intervention of a grain boundary, but grains exposed on the bottom surface side (the side closer to the oriented alumina substrate) included grains which had ceased to grow halfway.

Then, the vicinity of the top surface and the vicinity of the bottom surface of the GaN buffer layer were observed using a method similar to Example 5. As a result, the cross-sectional average diameter of the top surface was about 220 µm, and the cross-sectional average diameter of the bottom surface was about 20 µm. Thus, the cross-sectional average diameter was larger at the top surface than at the bottom surface, and the $D_T/D_B$ of this grain diameter increasing layer was about 11.0, which is the ratio of the cross-sectional average diameter at the top surface $D_T$ to the cross-sectional average diameter at the bottom surface $D_B$. The aspect ratio $T/D_T$ was about 1.2, which is defined as the ratio of the thickness T of the grain diameter increasing layer to the cross-sectional average diameter $D_T$ of the grains constituting the surface facing the side opposite to the oriented polycrystalline alumina sintered body substrate. The above measurement may be carried out after emphasizing the interface by thermal etching or chemical etching. The volume resistivity was measured by a method similar to (1a) of Example 2, and the volume resistivity was $1 \times 10^{-2}$ Ω·cm.

(3) Production and Evaluation of Vertically-Structured Light Emitting Device

By a method similar to (3c) of Example 1, a light emitting functional layer was formed on a substrate provided with a buffer layer, and a light emitting device substrate was thus obtained. Measurement of the cross-sectional average diameter of the light emitting functional layer by a method similar to (3c) of Example 1 resulted in an average grain diameter of about 220 µm at the plate surface of the light emitting functional layer. A vertically-structured light emitting device was produced by a method similar to Example 2(2), and when I-V measurement was performed, rectifying characteristics were confirmed. Moreover, with an electric current flowing in the forward direction, emission of light having a wavelength of 450 nm was confirmed. However, it was found that the luminance was high to some extent but weaker than that of Example 5.

Example 7

(1) Production of c-plane Oriented Alumina Sintered Body

A c-plane oriented alumina substrate was produced as in Example 6 except that the temperature of firing in a hot press was 1750° C. The resulting sintered body was fixed to a ceramic surface plate and ground to #2000 using a grinding wheel to flatten the plate surface. Next, the plate surface was smoothed by lapping using diamond abrasive grains to obtain an oriented alumina sintered body having a diameter of 50.8 mm (2 inches) and a thickness of 1 mm as an oriented alumina substrate. Flatness was improved by reducing the size of abrasive grains from 3 µm to 0.5 µm in a stepwise manner. The average roughness Ra after processing was 4 nm. Determination of the degree of c-plane orientation and the average grain diameter at the plate surface by methods similar to Example 1 resulted in a degree of c-plane orientation of 96% and an average grain diameter of 14 µm.

(2) Formation of GaN Buffer Layer by Na Flux

A seed crystal substrate having a 3 µm thick GaN film stacked on the oriented alumina substrate was produced as in (3a) of Example 1. A Ge-doped GaN film was formed on this seed crystal substrate as in (1a) of Example 2 except that the retention time was 30 hours. In the resulting sample, Ge-doped gallium nitride crystals grew on the entire surface of the 50.8 mm (2 inches) seed crystal substrate, and the crystal thickness was about 0.3 mm. No cracks were observed.

Then, the sample was processed by the same method as Example 1(3b) to obtain a substrate in which a buffer layer having a thickness of about 90 µm composed of germanium-doped gallium nitride crystals was formed on an oriented alumina substrate (Example 7-1). The average roughness Ra at the plate surface of gallium nitride crystals after processing was 0.2 nm.

Moreover, Ge-doped gallium nitride crystals were produced as above and the plate surface (top surface) thereof was ground using #600 and #2000 grinding wheels to produce samples (Example 7-2 to Example 7-5) in which the thicknesses of buffer layers composed of the gallium nitride crystals were 70, 50, 30, and 20 µm, and the plate surfaces were smoothed by lapping using diamond abrasive grains. The average roughness Ra of the top surface of each sample after processing was 0.2 nm.

(EBSD Measurement of Cross-Section of Ge-Doped GaN Buffer Layer)

Next, inverse pole figure mapping of the cross section of the GaN buffer layer of each sample was performed by a method similar to Examples 5 and 6, and it was found that the gallium nitride crystals formed a grain diameter increasing layer having a larger grain diameter on the top surface side (the side opposite to the oriented alumina substrate) than on the side closer to the oriented alumina substrate, and the shape of the gallium nitride crystals, being trapezoidal, triangular, or the like on the cross-sectional image, was not completely columnar. Moreover, it was found that, as the film thickens, there are grains that develop to have an increased grain diameter and reach the top surface, and grains that do not develop to reach the top surface. Although the reason of such a growth behavior is not clear, such a behavior is considered to be a result of growth that progressed in such a manner that fast-growing grains covered slow-growing grains as shown in FIG. 8. Therefore, among the gallium nitride grains constituting the grain diameter increasing layer, grains exposed on the top surface side (the side opposite to the oriented alumina substrate) connect to the bottom surface without intervention of a grain boundary, but grains exposed on the bottom surface side (the side closer to the oriented alumina substrate) included grains which had ceased to grow halfway.

Then, the vicinity of the top surface and the vicinity of the bottom surface of the GaN buffer layer were observed using a method similar to Examples 5 and 6. The thickness of the buffer layer, the cross-sectional average diameter ($D_T$) at the top surface, the cross-sectional average diameter at the bottom surface ($D_B$), the ratio $D_T/D_B$ of the cross-sectional average diameter at the top surface of the grain diameter increasing layer ($D_T$) to the cross-sectional average diameter at the bottom surface ($D_B$), and the aspect ratio $T/D_T$ defined as the ratio of the thickness T of the grain diameter increasing layer to the cross-sectional average diameter $D_T$ of the grains constituting the surface facing the side opposite to the oriented polycrystalline alumina sintered body substrate were as shown in Table 1. The volume resistivity was measured by a method similar to (1a) of Example 2, and the volume resistivity of each sample was $1 \times 10^{-2}$ Ω·cm.

TABLE 1

| No. | Thickness of gallium nitride buffer layer (μm) | $D_T$ (μm) | $D_B$ (μm) | $D_T/D_B$ | Aspect ratio | Average cross-sectional diameter of outermost surface of light emitting functional layer (μm) |
|---|---|---|---|---|---|---|
| Ex. 7-1 | 90 | 76 | 14 | 5.4 | 1.2 | 76 |
| Ex. 7-2 | 70 | 59 | 14 | 4.2 | 1.2 | 59 |
| Ex. 7-3 | 50 | 42 | 14 | 3.0 | 1.2 | 42 |
| Ex. 7-4 | 30 | 25 | 14 | 1.8 | 1.2 | 25 |
| Ex. 7-5 | 20 | 17 | 14 | 1.2 | 1.2 | 17 |

(3) Production and Evaluation of Vertically-Structured Light Emitting Device

By a method similar to (3c) of Example 1, a light emitting functional layer was formed on the substrate, and a light emitting device substrate was thus obtained. Table 1 shows the results of determining the cross-sectional average diameters of the light emitting functional layers by a method similar to (3c) of Example 1. As a result of producing vertically-structured light emitting devices by a method similar to Example 2(2), rectifying characteristics were confirmed by I-V measurement in all samples, and application of electricity in the forward direction confirmed emission of light having a wavelength of 450 nm. The luminance of each sample was high to some extent, and had a relationship of Example 7-1>Example 7-2>Example 7-3>Example 7-4>Example 7-5.

Example 8

(1) Production of c-plane Oriented Alumina Sintered Body

A plate-shaped alumina powder (manufactured by Kinsei Matec Co., Ltd., grade 02025), a fine alumina powder (manufactured by Taimei Chemicals Co., Ltd., grade TM-DAR), aluminum fluoride (manufactured by Kanto Chemical Co., Inc.), and a magnesium oxide powder (manufactured by Ube Material Industries, Ltd., grade 500A) were provided as raw materials, and 5 parts by weight of the plate-shaped alumina powder, 95 parts by weight of the fine alumina powder, 0.05 parts by weight of the aluminum fluoride powder, and 0.025 parts by weight of the magnesium oxide powder were mixed to obtain an alumina raw material. Next, 8 parts by weight of a binder (polyvinyl butyral: product name BM-2, manufactured by Sekisui Chemical Co., Ltd.), 4 parts by weight of a plasticizer (DOP: di(2-ethylhexyl) phthalate, manufactured by Kurogane Kasei Co., Ltd.), 2 parts by weight of a dispersing agent (Rheodol SP-O30, manufactured by Kao Corporation), and a dispersion medium (a mixture of xylene and 1-butanol in a weight ratio of 1:1) were mixed with 100 parts by weight of the alumina raw material. The amount of the dispersion medium was adjusted so that the slurry viscosity was 20000 cP. The slurry prepared as above was shaped into a sheet form on a PET film by a doctor blade method so as to have a thickness after drying of 100 μm. The resulting tape was cut into circles having a diameter of 50.8 mm (2 inches), then 30 pieces were stacked and placed on an Al plate having a thickness of 10 mm, and then vacuum packing was performed. This vacuum pack was subjected to isostatic pressing in hot water at 85° C. under a pressure of 100 kgf/cm², and a disc-shaped green body was obtained.

The resulting green body was placed in a degreasing furnace and degreased at 600° C. for 10 hours. The resulting degreased body was fired in a hot press at 1800° C. for 4 hours under a surface pressure of 200 kgf/cm² in nitrogen using a graphite mold.

The sintered body obtained in this way was fixed to a ceramic surface plate and ground to #2000 using a grinding wheel to flatten the plate surface. Next, the plate surface was smoothed by lapping using diamond abrasive grains to obtain an oriented alumina sintered body having a diameter of 50.8 mm (2 inches) and a thickness of 1 mm as an oriented alumina substrate. Flatness was improved by reducing the size of abrasive grains from 3 μm to 0.5 μm in a stepwise manner. The average roughness Ra after processing was 4 nm. Determination of the degree of c-plane orientation and the average grain diameter at the plate surface by methods similar to Example 1 resulted in a degree of c-plane orientation of 92% and an average grain diameter of about 64 μm.

(2) Formation of GaN Buffer Layer by Na Flux

A seed crystal substrate having a 3 μm thick GaN film stacked on the oriented alumina substrate was produced as in (3a) of Example 1. A Ge-doped GaN film was formed on this seed crystal substrate as in (1a) of Example 2 except that the retention time was 30 hours. In the resulting sample, Ge-doped gallium nitride crystals grew on the entire surface of the 50.8 mm (2 inches) seed crystal substrate, and the crystal thickness was about 0.3 mm. No cracks were observed.

Then, the sample was processed by the same method as Example 1(3b) to obtain a substrate in which a buffer layer having a thickness of about 90 μm composed of germanium-doped gallium nitride crystals was formed on an oriented alumina substrate. The average roughness Ra at the plate surface of gallium nitride crystals after processing was 0.2 nm.

(EBSD Measurement of Cross-Section of Ge-Doped GaN Buffer Layer)

Next, inverse pole figure mapping of the cross section of the GaN buffer layer of each sample was performed by a method similar to Examples 5 to 7, and it was found that the gallium nitride crystals formed a grain diameter increasing layer having a larger grain diameter on the top surface side (the side opposite to the oriented alumina substrate) than on the side closer to the oriented alumina substrate, and the shape of the gallium nitride crystals, being trapezoidal, triangular, or the like on the cross-sectional image, was not completely columnar. Moreover, it was found that, as the film thickens, there are grains that develop to have an increased grain diameter and reach the top surface, and grains that do not develop to reach the top surface. Although the reason of such a growth behavior is not clear, such a behavior is considered to be a result of growth that progressed in such a manner that fast-growing grains covered slow-growing grains as shown in FIG. 8. Therefore, among the gallium nitride grains constituting the grain diameter increasing layer, grains exposed on the top surface side (the side opposite to the oriented alumina substrate) connect to the bottom surface without intervention of a grain boundary, but grains exposed on the bottom surface side (the side closer to the oriented alumina substrate) included grains which had ceased to grow halfway.

Then, the vicinity of the top surface and the vicinity of the bottom surface of the GaN buffer layer were observed using a method similar to Examples 5 to 7. As a result, the cross-sectional average diameter of the top surface was about 80 μm, and the cross-sectional average diameter of the bottom surface was about 64 μm. Thus, the cross-sectional average diameter was larger at the top surface than at the bottom surface, and the $D_T/D_B$ of this grain diameter increasing layer was about 1.3, which is the ratio of the cross-sectional average diameter at the top surface $D_T$ to the cross-sectional average diameter at the bottom surface $D_B$. The aspect ratio $T/D_T$ was about 1.1, which is defined as the ratio of the thickness T of the grain diameter increasing layer to the cross-sectional average diameter $D_T$ of the grains constituting the surface facing the side opposite to the oriented polycrystalline alumina sintered body substrate. The above measurement may be carried out after emphasizing the interface by thermal etching or chemical etching. The volume resistivity was measured by a method similar to (1a) of Example 2, and the volume resistivity was $1 \times 10^{-2}$ Ω·cm.

(3) Production and Evaluation of Vertically-Structured Light Emitting Device

By a method similar to (3c) of Example 1, a light emitting functional layer was formed on the substrate, and a light emitting device substrate was thus obtained. Measurement of the cross-sectional average diameter of the light emitting functional layer by a method similar to (3c) of Example 1 resulted in an average grain diameter of about 80 μm at the plate surface of the light emitting functional layer. A vertically-structured light emitting device was produced by a method similar to Example 2(2), and when I-V measurement was performed, rectifying characteristics were confirmed. Moreover, with an electric current flowing in the forward direction, emission of light having a wavelength of 450 nm was confirmed.

Example 9

(1) Production of c-plane Oriented Alumina Sintered Body

A c-plane oriented alumina substrate was produced as in Example 8 except that the amount of aluminum fluoride powder was 0.02 parts by weight. The sintered body obtained in this way was fixed to a ceramic surface plate and ground to #2000 using a grinding wheel to flatten the plate surface. Next, the plate surface was smoothed by lapping using diamond abrasive grains to obtain an oriented alumina sintered body having a diameter of 50.8 mm (2 inches) and a thickness of 1 mm as an oriented alumina substrate. Flatness was improved by reducing the size of abrasive grains from 3 μm to 0.5 μm in a stepwise manner. The average roughness Ra after processing was 4 nm. Determination of the degree of c-plane orientation and the average grain diameter at the plate surface by methods similar to Example 1 resulted in a degree of c-plane orientation of 94% and an average grain diameter of 41 μm.

(2) Formation of GaN Buffer Layer by Na Flux and Production of Vertically-Structured Light Emitting Device A seed crystal substrate having a 3 μm thick GaN film stacked on the oriented alumina substrate was produced as in (3a) of Example 1. A germanium-doped GaN film was formed on this seed crystal substrate as in (1a) of Example 2 except that the retention time was 30 hours. In the resulting sample, Ge-doped gallium nitride crystals grew on the entire surface of the 50.8 mm (2 inches) seed crystal substrate, and the crystal thickness was about 0.3 mm. No cracks were observed.

Then, the sample was processed by the same method as Example 1(3b) to obtain a substrate in which a buffer layer having a thickness of about 140 μm composed of germanium-doped gallium nitride crystals was formed on an oriented alumina substrate. The average roughness Ra at the plate surface of gallium nitride crystals after processing was 0.2 nm.

Next, a light emitting device substrate was obtained by a method similar to (3c) of Example 1. Measurement of the cross-sectional average diameter of the light emitting functional layer by a method similar to (3c) of Example 1 resulted in an average grain diameter of about 81 μm at the plate surface of the light emitting functional layer.

Vacuum deposition was performed on the resulting light emitting device substrate to deposit a Ag film to a thickness of 200 nm as a reflective anode layer onto the p-type layer. Thereafter, to improve ohmic contact characteristics, 500° C. heat treatment was performed in a nitrogen atmosphere for 30 seconds. Next, using Sn—Ag soldering, the Ag film serving as a reflective anode layer on the p-type layer and a separately provided 50.8 mm (2 inches) p-type Si substrate (a mounting substrate) having a thickness of 280 μm were attached to each other, and joined by reflowing at 250° C. for 60 seconds. Next, the oriented alumina substrate portion was removed by grinding it with a grinding wheel to expose the GaN buffer layer. Furthermore, the GaN buffer layer was subjected to grinding to be thinned by about 80 μm so that the buffer layer had a thickness of 60 μm. The exposed buffer layer was ground with #600 and #2000 grinding wheels to flatten the plate surface. Then, the plate surface of the buffer layer was smoothed by lapping using diamond abrasive grains. At this time, flatness was improved by reducing the size of abrasive grains from 3 μm to 0.1 μm in a stepwise manner. The average roughness Ra at the plate surface of the GaN buffer layer after processing was 0.2 nm. Next, using photolithography and vacuum deposition, Ti/Al/Ni/Au films as a cathode were patterned on the GaN buffer layer in a thickness of 15 nm, 70 nm, 12 nm, and 60 nm, respectively. The cathode was patterned into a shape having an opening so that light can be extracted from a portion where the electrode was not formed. Thereafter, to improve ohmic contact characteristics, 700° C. heat treatment was performed in a nitrogen atmosphere for 30 seconds. The wafer obtained in this way was cut into a chip and, further, furnished with a lead frame to provide a vertically-structured light emitting device.

(EBSD Measurement of Cross-Section of Ge-Doped GaN Buffer Layer)

A vertically-structured light emitting device separately produced by a method as described above was cut to expose the plane perpendicular to the plate surface, the plane was polished using a CP polisher (manufactured by JEOL Ltd., IB-09010CP), and then inverse pole figure mapping of the GaN buffer layer was performed with an electron-beam backscattering diffractometer (EBSD) (manufactured by TSL Solutions). It can be understood from the results that the light emitting functional layer side (the top surface side) of the GaN buffer layer constitutes a grain diameter increasing layer, and the shape of the gallium nitride crystals, being trapezoidal, triangular, or the like on the cross-sectional image, is not completely columnar. Moreover, it was found that, as the film thickens, there are grains that develop to have an increased grain diameter and reach the top surface, and grains that do not develop to reach the top surface.

Although the reason of such a growth behavior is not clear, such a behavior is considered to be a result of growth that progressed in such a manner that fast-growing grains covered slow-growing grains as shown in FIG. 8. Therefore, among the gallium nitride grains constituting the grain diameter increasing layer, grains exposed at the interface on the light emitting functional layer side (the top surface side) connect to the bottom surface without intervention of a grain boundary, but grains exposed on the cathode side (the bottom surface side) included grains which had ceased to grow halfway.

Next, the vicinity of the top surface furnished with a light emitting functional layer and the vicinity of the bottom surface furnished with a cathode of the GaN buffer layer were observed using a method similar to Examples 5 to 8. As a result, the cross-sectional average diameter at the top surface was about 81 μm, and the cross-sectional average diameter at the bottom surface was about 61 μm. Thus, the cross-sectional average diameter was larger at the top surface than at the bottom surface, and the $D_T/D_B$ of this grain diameter increasing layer was about 1.3, which is the ratio of the cross-sectional average diameter at the top surface $D_T$ to the cross-sectional average diameter at the bottom surface $D_B$. The aspect ratio $T/D_T$ was about 0.7, which is defined as the ratio of the thickness T of the grain diameter increasing layer to the cross-sectional average diameter $D_T$ of the grains constituting the surface facing the side opposite to the oriented polycrystalline alumina sintered body substrate. The above measurement may be carried out after emphasizing the interface by thermal etching or chemical etching.
(3) Evaluation of Vertically-Structured Light Emitting Device Rectifying characteristics were confirmed from I-V measurement performed by a method similar to Example 2(2). Moreover, with an electric current flowing in the forward direction, emission of light having a wavelength of 450 nm was confirmed. However, it was found that the luminance was high to some extent but weaker than that of Example 8.

Example 10

(1) Production of c-plane Oriented Alumina Sintered Body

A plate-shaped alumina powder (manufactured by Kinsei Matec Co., Ltd., grade 10030), a fine alumina powder (manufactured by Taimei Chemicals Co., Ltd., grade TM-DAR), and a magnesium oxide powder (manufactured by Ube Material Industries, Ltd., grade 500A) were prepared as raw materials, and 5 parts by weight of the plate-shaped alumina powder, 95 parts by weight of the fine alumina powder, and 0.025 parts by weight of the magnesium oxide powder were mixed to obtain an alumina raw material. Next, 8 parts by weight of a binder (polyvinyl butyral: product name BM-2, manufactured by Sekisui Chemical Co., Ltd.), 4 parts by weight of a plasticizer (DOP: di(2-ethylhexyl) phthalate, manufactured by Kurogane Kasei Co., Ltd.), 2 parts by weight of a dispersing agent (Rheodol SP-O30, manufactured by Kao Corporation), and a dispersion medium (a mixture of xylene and 1-butanol in a weight ratio of 1:1) were mixed with 100 parts by weight of the alumina raw material. The amount of the dispersion medium was adjusted so that the slurry viscosity was 20000 cP. The slurry prepared as above was shaped into a sheet form on a PET film by a doctor blade method so as to have a thickness after drying of 100 μm. The resulting tape was cut into circles having a diameter of 50.8 mm (2 inches), then 30 pieces were stacked and placed on an Al plate having a thickness of 10 mm, and then vacuum packing was performed. This vacuum pack was subjected to isostatic pressing in hot water at 85° C. under a pressure of 100 kgf/cm², and a disc-shaped green body was obtained.

The resulting green body was placed in a degreasing furnace and degreased at 600° C. for 10 hours. The resulting degreased body was fired in a hot press at 1800° C. for 4 hours under a surface pressure of 200 kgf/cm² in nitrogen using a graphite mold.

The sintered body obtained in this way was fixed to a ceramic surface plate and ground to #2000 using a grinding wheel to flatten the plate surface. Next, the plate surface was smoothed by lapping using diamond abrasive grains to obtain an oriented alumina sintered body having a diameter of 50.8 mm (2 inches) and a thickness of 1 mm as an oriented alumina substrate. Flatness was improved by reducing the size of abrasive grains from 3 μm to 0.5 μm in a stepwise manner. The average roughness Ra after processing was 4 nm. Determination of the degree of c-plane orientation and the average grain diameter at the plate surface by methods similar to Example 1 resulted in a degree of c-plane orientation of 99% and an average grain diameter of about 24 μm.
(2) Formation of GaN Buffer Layer by Na Flux and Production of Vertically-Structured Light Emitting Device A seed crystal substrate having a 3 μm thick GaN film stacked on the oriented alumina substrate was produced as in (3a) of Example 1. A germanium-doped GaN film was formed on this seed crystal substrate as in (1a) of Example 2 except that the retention time was 30 hours. In the resulting sample, Ge-doped gallium nitride crystals grew on the entire surface of the 50.8 mm (2 inches) seed crystal substrate, and the crystal thickness was about 0.3 mm. No cracks were observed.

Then, the sample was processed by the same method as Example 1(3b) to obtain a substrate in which a buffer layer having a thickness of about 130 μm composed of germanium-doped gallium nitride crystals was formed on an oriented alumina substrate. The average roughness Ra at the plate surface of gallium nitride crystals after processing was 0.2 nm.

Next, a light emitting device substrate was obtained by a method similar to (3c) of Example 1. Measurement of the cross-sectional average diameter of the light emitting functional layer by a method similar to (3c) of Example 1 resulted in an average grain diameter of about 75 μm at the plate surface of the light emitting functional layer.

Vacuum deposition was performed on the resulting light emitting device substrate to deposit a Ag film to a thickness of 200 nm as a reflective anode layer onto the p-type layer. Thereafter, to improve ohmic contact characteristics, 500° C. heat treatment was performed in a nitrogen atmosphere for 30 seconds. Next, using Sn—Ag soldering, the Ag film serving as a reflective anode layer on the p-type layer and a separately provided 50.8 mm (2 inches) p-type Si substrate (a mounting substrate) having a thickness of 280 μm were attached to each other, and joined by reflowing at 250° C. for 60 seconds. Next, the oriented alumina substrate portion was removed by grinding it with a grinding wheel to expose the GaN buffer layer. Furthermore, the GaN buffer layer was subjected to grinding to be thinned by about 90 μm so that the buffer layer had a thickness of 40 μm. The exposed buffer layer was ground with #600 and #2000 grinding wheels to flatten the plate surface. Then, the plate surface of the buffer layer was smoothed by lapping using diamond abrasive grains. At this time, flatness was improved by reducing the size of abrasive grains from 3 μm to 0.1 μm in a stepwise manner. The average roughness Ra at the plate surface of the GaN buffer layer after processing was 0.2 nm. Next, using photolithography and vacuum deposition, Ti/Al/Ni/Au films as a cathode were patterned on the GaN buffer layer in a thickness of 15 nm, 70 nm, 12 nm, and 60 nm, respectively. The cathode was patterned into a shape having an opening so that light can be extracted from a portion where the electrode was not formed. Thereafter, to improve ohmic contact characteristics, 700° C. heat treatment was performed in a nitrogen atmosphere for 30 seconds. The wafer obtained in this way was cut into a chip and, further, furnished with a lead frame to provide a vertically-structured light emitting device.

(EBSD Measurement of Cross-Section of Ge-Doped GaN Buffer Layer)

A vertically-structured light emitting device separately produced by a method as described above was cut to expose the plane perpendicular to the plate surface, the plane was polished using a CP polisher (manufactured by JEOL Ltd., IB-09010CP), and then inverse pole figure mapping of the GaN buffer layer was performed with an electron-beam backscattering diffractometer (EBSD) (manufactured by TSL Solutions). It can be understood from the results that the light emitting functional layer side (the top surface side) of the GaN buffer layer constitutes a grain diameter increasing layer, and the shape of the gallium nitride crystals, being trapezoidal, triangular, or the like on the cross-sectional image, is not completely columnar. Moreover, it was found that, as the film thickens, there are grains that develop to have an increased grain diameter and reach the top surface, and grains that do not develop to reach the top surface. Although the reason of such a growth behavior is not clear, such a behavior is considered to be a result of growth that progressed in such a manner that fast-growing grains covered slow-growing grains as shown in FIG. 8. Therefore, among the gallium nitride grains constituting the grain diameter increasing layer, grains exposed at the interface on the light emitting functional layer side (the top surface side) connect to the bottom surface without intervention of a grain boundary, but grains exposed on the cathode side (the bottom surface side) included grains which had ceased to grow halfway.

Next, the vicinity of the top surface furnished with a light emitting functional layer and the vicinity of the bottom surface furnished with a cathode of the GaN buffer layer were observed using a method similar to Examples 5 to 9. As a result, the cross-sectional average diameter at the top surface was about 75 μm, and the cross-sectional average diameter at the bottom surface was about 60 μm. Thus, the cross-sectional average diameter was larger at the top surface than at the bottom surface, and the $D_T/D_B$ of this grain diameter increasing layer was about 1.3, which is the ratio of the cross-sectional average diameter at the top surface $D_T$ to the cross-sectional average diameter at the bottom surface $D_B$. The aspect ratio $T/D_T$ was about 0.5, which is defined as the ratio of the thickness T of the grain diameter increasing layer to the cross-sectional average diameter $D_T$ of the grains constituting the surface facing the side opposite to the oriented polycrystalline alumina sintered body substrate. The above measurement may be carried out after emphasizing the interface by thermal etching or chemical etching.

(3) Evaluation of Vertically-Structured Light Emitting Device

Rectifying characteristics were confirmed from I-V measurement performed by a method similar to Example 2(2). Moreover, with an electric current flowing in the forward direction, emission of light having a wavelength of 450 nm was confirmed. However, it was found that the luminance was high to some extent but weaker than that of Example 9.

What is claimed is:

1. A composite substrate for light emitting devices, comprising:
   a substrate composed of an oriented polycrystalline alumina sintered body;
   a light emitting functional layer formed on the substrate and having two or more layers composed of semiconductor single crystal grains, wherein each of the two or more layers has a single crystal structure in a direction approximately normal to the substrate;
   wherein the semiconductor single crystal grains constituting a top surface of the light emitting functional layer connect to a bottom surface of the light emitting functional layer facing toward the oriented polycrystalline alumina sintered body substrate without intervention of a grain boundary,
   wherein a lower layer among the layers constituting the light emitting functional layer, wherein the lower layer is located in a position that is closer to the oriented polycrystalline alumina sintered body substrate than an interface or a layer that actually emits light, is a grain diameter increasing layer, in which the semiconductor crystal grains constituting the at least one layer increase in cross-sectional average diameter from a side closer to the substrate toward a side opposite to the substrate, and
   wherein the grain diameter increasing layer has a $D_T/D_B$ of greater than 1.0, wherein the $D_T/D_B$ is a ratio of a cross-sectional average diameter $D_T$ to a cross-sectional average diameter $D_B$, wherein the cross-sectional average diameter $D_T$ is a cross-sectional average diameter of the semiconductor single crystal grains constituting a top surface of the grain diameter increasing layer as determined at the top surface, the top surface facing a side opposite to the oriented polycrystalline alumina sintered body substrate, and wherein the cross-sectional average diameter $D_B$ is a cross-sectional average diameter of the semiconductor single crystal grains constituting a bottom surface of the grain diameter increasing layer as determined at the bottom surface, the bottom surface facing toward the substrate.

2. The composite substrate for light emitting devices according to claim 1, wherein a cross-sectional average diameter of the semiconductor single crystal grains at an outermost surface of the light emitting functional layer is 0.3 μm or greater.

3. The composite substrate for light emitting devices according to claim 2, wherein the cross-sectional average diameter is 3 μm or greater.

4. The composite substrate for light emitting devices according to claim 2, wherein the cross-sectional average diameter is 20 μm or greater.

5. The composite substrate for light emitting devices according to claim 1, wherein an average grain diameter at a plate surface of alumina grains constituting the oriented polycrystalline alumina sintered body is 0.3 to 1000 μm.

6. The composite substrate for light emitting devices according to claim 1, wherein each layer of the light emitting functional layer has a structure in which grains are grown mostly in conformity with crystal orientation of the oriented polycrystalline alumina sintered body.

7. The composite substrate for light emitting devices according to claim 1, wherein the layers constituting the light emitting functional layer comprise two or more selected from the group consisting of an n-type layer doped with an n-type dopant, a p-type layer doped with a p-type dopant, and an active layer.

8. The composite substrate for light emitting devices according to claim 1, wherein the light emitting functional layer comprises a p-n junction and/or a heterojunction and/or a quantum well junction, each of which has a light emitting function.

9. The composite substrate for light emitting devices according to claim 1, wherein each layer constituting the light emitting functional layer is composed of a gallium-nitride-based material.

10. The composite substrate for light emitting devices according to claim 1, wherein the $D_T/D_B$ is 1.5 or greater.

11. The composite substrate for light emitting devices according to claim 1, wherein the grain diameter increasing layer has an aspect ratio $T/D_T$ of 0.7 or greater, wherein the aspect ratio $T/D_T$ is defined as a ratio of a thickness T of the grain diameter increasing layer to a cross-sectional average diameter $D_T$ of the semiconductor single crystal grains constituting a top surface of the grain diameter increasing layer as determined at the top surface, the top surface facing a side opposite to the oriented polycrystalline alumina sintered body substrate.

12. The composite substrate for light emitting devices according to claim 1, wherein the oriented polycrystalline alumina sintered body is c-plain oriented.

13. The composite substrate for light emitting devices according to claim 1, wherein the oriented polycrystalline alumina sintered body has a degree of orientation of 50% or greater.

14. The composite substrate for light emitting devices according to claim 1, further comprising an electrode layer and/or a phosphor layer on the light emitting functional layer.

15. The composite substrate for light emitting devices according to claim 1, wherein the substrate has a diameter of 100 mm or greater.

16. The composite substrate for light emitting devices according to claim 1, wherein the oriented polycrystalline alumina sintered body is translucent.

17. A light emitting device, which is produced with the composite substrate for light emitting devices according to claim 1.

18. A method for manufacturing a composite substrate for light emitting devices according to claim 1, the method comprising the steps of:
providing an oriented polycrystalline alumina sintered body as a substrate;
forming a seed crystal layer comprising gallium nitride on the substrate by MOCVD; and
forming a layer comprising gallium nitride as a buffer layer on the seed crystal layer by Na flux.

19. The method according to claim 18, further comprising the step of forming a light emitting functional layer composed of a gallium-nitride-based material on the buffer layer.

20. The composite substrate for light emitting devices according to claim 1, further comprising a buffer layer between the light emitting functional layer and the oriented polycrystalline alumina sintered body substrate.

21. A composite substrate for light emitting devices, comprising:
a substrate composed of an oriented polycrystalline alumina sintered body;
a light emitting functional layer formed on the substrate and having two or more layers composed of semiconductor single crystal grains, wherein each of the two or more layers has a single crystal structure in a direction approximately normal to the substrate;
wherein the semiconductor single crystal grains constituting a top surface of the light emitting functional layer connect to a bottom surface of the light emitting functional layer facing toward the oriented polycrystalline alumina sintered body substrate, without intervention of a grain boundary, and
wherein a cross-sectional average diameter of the semiconductor single crystal grains at an outermost surface of the light emitting functional layer is 20 µm or greater.

22. The composite substrate for light emitting devices according to claim 21, wherein the cross-sectional average diameter is 50 µm or greater and 500 µm or less.

23. The composite substrate for light emitting devices according to claim 21, wherein an average grain diameter at a plate surface of alumina grains constituting the oriented polycrystalline alumina sintered body is 0.3 to 1000 µm.

24. The composite substrate for light emitting devices according to claim 21, wherein each layer of the light emitting functional layer has a structure in which grains are grown mostly in conformity with crystal orientation of the oriented polycrystalline alumina sintered body.

25. The composite substrate for light emitting devices according to claim 21, wherein the layers constituting the light emitting functional layer comprise two or more selected from the group consisting of an n-type layer doped with an n-type dopant, a p-type layer doped with a p-type dopant, and an active layer.

26. The composite substrate for light emitting devices according to claim 21, wherein the light emitting functional layer comprises a p-n junction and/or a heterojunction and/or a quantum well junction, each of which has a light emitting function.

27. The composite substrate for light emitting devices according to claim 21, wherein each layer constituting the light emitting functional layer is composed of a gallium-nitride-based material.

28. The composite substrate for light emitting devices according to claim 21, wherein a lower layer among the layers constituting the light emitting functional layer, wherein the lower layer is located in a position that is closer to the oriented polycrystalline alumina sintered body substrate than an interface or a layer that actually emits light, is a grain diameter increasing layer, in which the semiconductor crystal grains constituting the at least one layer increase in cross-sectional average diameter from a side closer to the substrate toward a side opposite to the substrate.

29. The composite substrate for light emitting devices according to claim 28, wherein the grain diameter increasing layer has a $D_T/D_B$ of greater than 1.0, wherein the $D_T/D_B$ is a ratio of a cross-sectional average diameter $D_T$ to a cross-sectional average diameter $D_B$, wherein the cross-sectional average diameter $D_T$ is a cross-sectional average diameter of the semiconductor single crystal grains constituting a top surface of the grain diameter increasing layer as determined at the top surface, the top surface facing a side opposite to the oriented polycrystalline alumina sintered body substrate, and wherein the cross-sectional average diameter $D_B$ is a cross-sectional average diameter of the semiconductor single crystal grains constituting a bottom surface of the grain diameter increasing layer as determined at the bottom surface, the bottom surface facing toward the substrate.

30. The composite substrate for light emitting devices according to claim 28, wherein the grain diameter increasing layer has an aspect ratio $T/D_T$ of 0.7 or greater, wherein the aspect ratio $T/D_T$ is defined as a ratio of a thickness T of the grain diameter increasing layer to a cross-sectional average diameter $D_T$ of the semiconductor single crystal grains constituting a top surface of the grain diameter increasing layer as determined at the top surface, the top surface facing a side opposite to the oriented polycrystalline alumina sintered body substrate.

31. The composite substrate for light emitting devices according to claim 21, wherein the oriented polycrystalline alumina sintered body is c-plain oriented.

32. The composite substrate for light emitting devices according to claim 21, wherein the oriented polycrystalline alumina sintered body has a degree of orientation of 50% or greater.

33. The composite substrate for light emitting devices according to claim 21, further comprising an electrode layer and/or a phosphor layer on the light emitting functional layer.

34. The composite substrate for light emitting devices according to claim 21, wherein the substrate has a diameter of 100 mm or greater.

35. The composite substrate for light emitting devices according to claim 21, wherein the oriented polycrystalline alumina sintered body is translucent.

36. A light emitting device, which is produced with the composite substrate for light emitting devices according to claim 21.

37. A method for manufacturing a composite substrate for light emitting devices according to claim 21, the method comprising the steps of:
   providing an oriented polycrystalline alumina sintered body as a substrate;
   forming a seed crystal layer comprising gallium nitride on the substrate by MOCVD; and
   forming a layer comprising gallium nitride as a buffer layer on the seed crystal layer by Na flux.

38. The method according to claim 37, further comprising the step of forming a light emitting functional layer composed of a gallium-nitride-based material on the buffer layer.

39. The composite substrate for light emitting devices according to claim 21, further comprising a buffer layer between the light emitting functional layer and the oriented polycrystalline alumina sintered body substrate.

* * * * *